United States Patent
Norman et al.

(10) Patent No.: US 11,302,531 B2
(45) Date of Patent: Apr. 12, 2022

(54) METHODS OF EXFOLIATING SINGLE CRYSTAL MATERIALS

(71) Applicants: Alliance for Sustainable Energy, LLC, Golden, CO (US); Colorado School of Mines, Golden, CO (US)

(72) Inventors: Andrew Gordon Norman, Evergreen, CO (US); Celeste Louise Melamed, Golden, CO (US); Eric Steven Toberer, Golden, CO (US); William Edwin McMahon, Denver, CO (US)

(73) Assignees: Alliance for Sustainable Energy, LLC, Golden, CO (US); Colorado School of Mines, Golden, CO (US)

( * ) Notice: Subject to any disclaimer, the term of this patent is extended or adjusted under 35 U.S.C. 154(b) by 126 days.

(21) Appl. No.: 17/003,194

(22) Filed: Aug. 26, 2020

(65) Prior Publication Data

US 2020/0395213 A1 Dec. 17, 2020

Related U.S. Application Data

(63) Continuation-in-part of application No. 16/009,037, filed on Jun. 14, 2018, now abandoned.

(60) Provisional application No. 62/519,636, filed on Jun. 14, 2017.

(51) Int. Cl.
*H01L 21/02* (2006.01)
*C30B 25/18* (2006.01)
*C30B 29/42* (2006.01)

(52) U.S. Cl.
CPC ...... *H01L 21/02658* (2013.01); *C30B 25/186* (2013.01); *C30B 29/42* (2013.01); *H01L 21/0262* (2013.01); *H01L 21/02477* (2013.01); *H01L 21/02546* (2013.01); *H01L 21/02598* (2013.01)

(58) Field of Classification Search
None
See application file for complete search history.

(56) References Cited

U.S. PATENT DOCUMENTS

| | | |
|---|---|---|
| 2017/0047223 A1 | 2/2017 | Wang et al. |
| 2018/0009676 A1 | 1/2018 | Pickett et al. |
| 2018/0186653 A1 | 7/2018 | Daniels et al. |

OTHER PUBLICATIONS

Alaskar et al., "Towards van der Waals Epitaxial Growth of GaAs on Si using a Graphene Buffer Layer," Advanced Functional Materials, 2014, 10 pages.
Alaskar et al., "Theoretical and experimental study of highly textured GaAs on silicon using a graphene buffer layer," Journal of Crystal Growth, vol. 425, 2015, pp. 268-273.
Atuchin et al., "Formation of Inert Bi2Se3(0001) Cleaved Surface," Crystal Growth & Design, vol. 11, 2011, pp. 5507-5514.
Desai, et al., "Gold-Mediated Exfoliation of Ultralarge Optoelectronically-Perfect Monolayers," Advanced Materials, vol. 28, 2016, pp. 4053-4058.

(Continued)

*Primary Examiner* — Bradley Smith
(74) *Attorney, Agent, or Firm* — Sam J. Barkley

(57) ABSTRACT

Disclosed herein are methods for exfoliation of single crystals allowing for growth of high crystalline quality on the exfoliated surfaces for III-V photovoltaics. Also disclosed herein are methods for growing GaAs (111) on layered-2D Bi$_2$Se$_3$ (0001) substrates in an MOCVD reactor.

20 Claims, 33 Drawing Sheets

(56) References Cited

OTHER PUBLICATIONS

Green et al., "Surface oxidation of the topological insulator Bi2Se3," Journal of the American Vacuum Society, vol. 34(6), Nov./Dec. 2016, p. 061403-1 through 061403-13.
Ji et al., "Crystal structure and elementary electronic properties of Bi-stabilized α-ln2Se3," Materials Research Bulletin, vol. 48, 2013, pp. 2517-2521.
Kim et al., "Principle of direct van der Waals epitaxy of single-crystalline films on epitaxial graphene," Nature Communications, pp. 1-7.
Kim et al., "Remote epitaxy through graphene enables two-dimensional material-based layer transfer," Nature, vol. 544, 2017, 12 pages.
Kuroda et al., "Epitaxial growth of II-VI semiconductor CdTe on a layered material NbSe2," Journal of Crystal Growth, vol. 262, 2004, pp. 383-387.
Li et al., "Growth of multilayers of Bi2Se3/ZnSe: Heteroepitaxial interface formation and strain," Applied Physics Letters, vol. 98, 2011, pp. 043104-1 through 043104-3.
Melamed et al., "Large Area Atomically Flat Surfaces via Exfoliation of Bulk Bi2Se3 Single Crystals," Chemistry of Materials, Sep. 2017, vol. 29, pp. 8472-8477.
Novoselov et al., "2D materials and van der Waals heterostructures," Applied Physics, Jul. 29, 2016, vol. 353, Issue 6298, pp. aac9439-1 through aac9439-11.
Sweet et al., "Controlled exfoliation of (100) GaAs-based devices by spalling fracture," Applied Physics Letters, vol. 108, 2016, pp. 011906-1 through 011906-4.
Ward et al., "Techno-economic analysis of three different substrate removal and reuse strategies for III-V solar cells: Techno-economic analysis for III-V solar cells," Progress in Photovoltaics Research Applications, Jan. 2016, 9 pages.

METHODS OF EXFOLIATING SINGLE CRYSTAL MATERIALS

CROSS-REFERENCE TO RELATED APPLICATIONS

This application claims priority under 35 U.S.C. § 119 to U.S. Provisional Patent Application No. 62/519,636 filed on Jun. 14, 2017, and U.S. patent application Ser. No. 16/009,037 filed on Jun. 14, 2018, the contents of which are hereby incorporated by reference in their entirety.

CONTRACTUAL ORIGIN

The United States Government has rights in this invention under Contract No. DE-AC36-08GO28308 between the United States Department of Energy and Alliance for Sustainable Energy, LLC, the Manager and Operator of the National Renewable Energy Laboratory.

BACKGROUND

The present invention relates to exfoliating slabs of single crystal materials to serve as substrates for textured and epitaxial growth. Related art lattice-matched substrates for epitaxial growth of III-V semiconductors are expensive. Further, related art lattice-mismatched substrates result in defects that reduce device performance. Accordingly, it would be advantageous to provide a method of producing low-cost lattice-matched substrates that can be used for epitaxial growth of III-V semiconductors and other materials.

The growth of high quality semiconductor devices on epitaxial substrates has enabled the development of a multitude of technologies ranging from light-emitting devices to photovoltaics. In many cases, epitaxial devices are grown on lattice-matched substrates. When lattice-matched substrates exist, however, their cost per unit area is often prohibitive. To overcome substrate cost, the photovoltaic industry has investigated homoepitaxy combined with substrate recycling. Substrate recycling (e.g. spalling, epitaxial liftoff, or use of a release layer) effectively reuses a sample multiple times, reducing the raw material cost. However, cost modeling of substrate recycling processes suggests that the cleaning and wafer repolishing steps are quite costly and reduces the effectiveness of substrate recycling. Low cost substrates (e.g. silicon) are an alternative; however, the associated lattice mismatch introduces deleterious defects (e.g. dislocations and stacking faults) that harm device development. Several technologies (e.g. epitaxial overgrowth and metamorphic buffer layers) are being investigated, although the techniques add an additional degree of complexity to device growth.

One example of the challenge presented by epitaxial growth is found in III-V solar cells. Wide-spread deployment of GaAs solar is limited by the cost of single-crystal substrates despite exhibiting a solar conversion efficiency of about 28.8%. While homoepitaxial growth yields record cells, the potential to scale up substrate recycling is uncertain due to cost and yield. Growth of GaAs on silicon is an alternative that has been pursued for decades, but lattice mismatch has limited one-sun solar cell efficiencies to a record cell efficiency of 21.2%. Growth on metal foils has also been explored for InP solar, which produces polycrystalline films and is another example of the concerted push toward mitigating substrate cost in photovoltaics research.

SUMMARY

In an aspect, disclosed herein exemplary embodiments of the invention provide methods for creating exfoliated slabs of single crystal materials. These slabs can be used as substrates to grow a variety of thin films by choosing different kinds of layered materials (e.g. materials with van der Waals bonding between 2D layers) for the slabs. In one exemplary embodiment, slabs of single crystal layered $In_2Se_3$ and $Bi_2Se_3$ are exfoliated for the epitaxial growth of GaAs for use in high-efficiency photovoltaic devices.

In an aspect, disclosed herein is a method for making a semiconductor device comprising exfoliating a Selenide-based 2D layered material whereby the exfoliation creates a surface of Selenide-based 2D layered material; and converting the surface of the Selenide-based 2D layered material to ZnSe. In an embodiment, the ZnSe is lattice matched to the layer of Selenide-based 2D layered material. In an embodiment, the ZnSe is lattice mismatched to the layer of Selenide-based 2D layered material. In an embodiment, the Selenide-based 2D layered material comprises $Bi_2Se_3$. In an embodiment, the surface of Selenide-based 2D layered material is converted to $In_2Se_3$ before converting the surface to ZnSe. In an embodiment, the method further comprises epitaxial growth of GaAs on the layer of ZnSe. In an embodiment, the method further comprises lifting off the semiconductor device from the Selenide-based 2D layered material and using the resulting Selenide-based-2D layered material for making a semiconductor device. In an embodiment, the resulting Selenide-based-2D layered material is a (0001) basal plane substantially free of surface steps. In an embodiment, the ZnSe is lattice matched to the layer of Selenide-based 2D layered material. In an embodiment, the ZnSe is lattice mismatched to the layer of Selenide-based 2D layered material. In an embodiment, the Selenide-based 2D layered material comprises $Bi_2Se_3$. In an embodiment, the surface of Selenide-based 2D layered material is converted to $In_2Se_3$ before converting the surface to ZnSe. In an embodiment, the method further comprises epitaxial growth of GaAs on the layer of ZnSe. In an embodiment, the method further comprises lifting off the semiconductor device from the Selenide-based 2D layered material and using the resulting Selenide-based-2D layered material for making a semiconductor device.

In an aspect, disclosed herein is a method for making patterned semiconductor layers, comprising exfoliating a $Bi_2Se_3$ material whereby the exfoliation creates a surface that is a (0001) basal plane substantially free of surface steps; and laterally patterning the surface by masking portions of the surface and converting the non-masked portions of the surface to ZnSe; and epitaxial growth of GaAs on the patterned layer of ZnSe. In an embodiment, the surface is converted to $In_2Se_3$ before converting the non-masked portions of the surface to ZnSe. In an embodiment, $Bi_2Se_3$ material that is a (0001) basal plane substantially free of surface steps is laterally patterned by masking portions of the surface material and converting the non-masked portions of the surface material to $In_2Se_3$ or ZnSe. In an embodiment, the surface of $Bi_2Se_3$ is converted to $In_2Se_3$ before laterally patterning the surface by masking portions of the surface and converting the non-masked portions of the surface to ZnSe.

In an aspect, disclosed herein is a method for growing GaAs (111) on layered-2D $Bi_2Se_3$ (0001) substrates in an MOCVD reactor wherein the first step is converting the surface layers of $Bi_2Se_3$ (0001) to ZnSe by annealing in the presence of diethylzinc, and the second step is growing GaAs in the presence of triethylgallium and AsH$_3$. In an embodiment, the annealing of Bi$_2$Se$_3$ (0001) in the presence of diethylzinc occurs at a temperature which decreases from 400° C. to 300° C. over about 20 min.

BRIEF DESCRIPTION OF THE DRAWINGS

Exemplary embodiments are illustrated in referenced figures of the drawings. It is intended that the embodiments and figures disclosed herein are to be considered illustrative rather than limiting.

DETAILED DESCRIPTION

Figure 1:
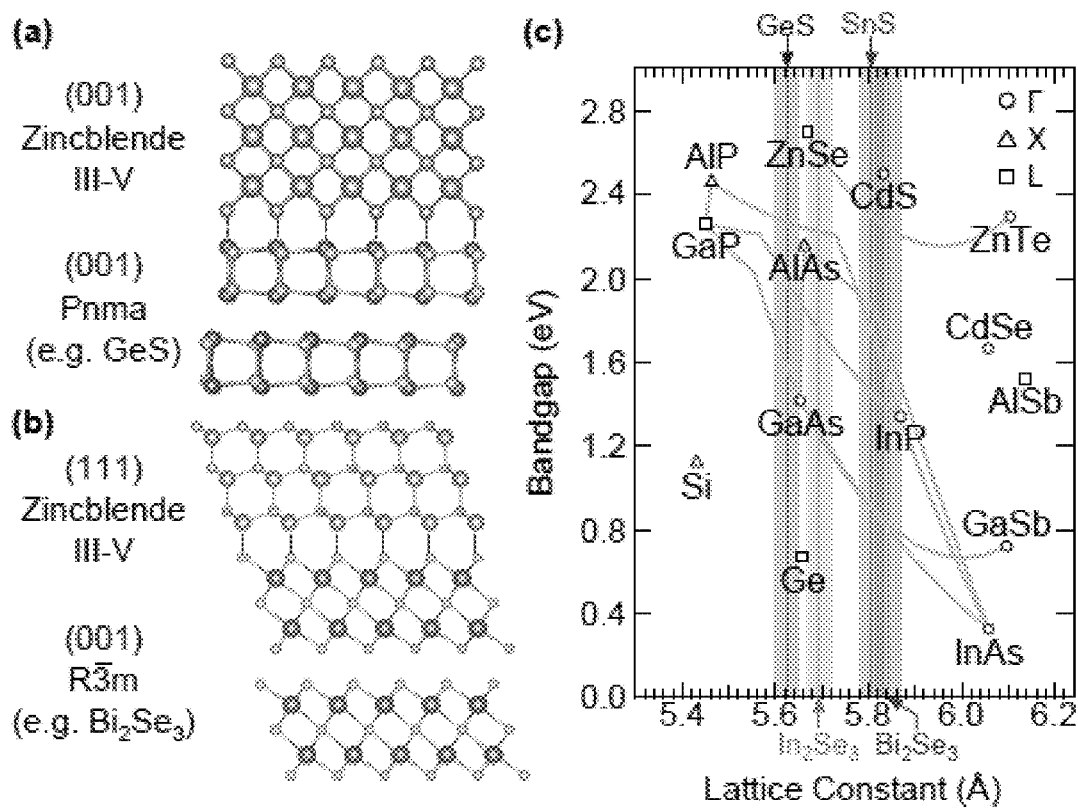
FIG. 1: The schematics in (a) and (b) demonstrate epitaxial relationships between van der Waals substrates and III-V films: (a) 2D materials with square or rectangular nets can template (001) zincblende growth while (b) hexagonal nets can template (111) zincblende growth. (c) Such growth would yield low lattice mismatch for a diverse range of III-V compositions. Vertical colored bands show +/−0.5% lattice mismatch with GeS (blue), SnS (green), In$_2$Se$_3$ (yellow) and Bi$_2$Se$_3$ (red).

Disclosed herein are compositions and methods for growth of cubic GaAs (111) on single-crystal 2D layered $Bi_2Se_3$ (0001) substrates achieved using a cubic ZnSe buffer layer. This growth sequence was chosen based upon observed reactions between $Bi_2Se_3$ (0001) substrates and both Ga and Zn. For the conditions used in a MOCVD reactor, triethylgallium (TEGa) interacts strongly with $Bi_2Se_3$ to form $Ga_2Se_3$, which can disrupt the nucleation and growth of GaAs. Therefore, a buffer layer is needed which prevents Ga—$Bi_2Se_3$ interactions while simultaneously providing a suitable growth surface for GaAs. ZnSe was chosen because it is lattice-matched to GaAs, and can be created by annealing the $Bi_2Se_3$ under a diethylzinc (DEZn) flux. Compositions were made using this growth sequence, characterized and exfoliated as a pathway toward reducing the substrate cost for III-V devices such as solar cells.

Several criteria must be satisfied to use 2D materials as substrates for photovoltaics: (i) to minimize minority recombination, single crystalline domains must be large enough to ensure long minority carrier lifetime, (ii) to minimize generation of non-radiative defects such as threading dislocations in the epitaxial film, a close lattice match between the III-V and the underlying 2D layered material is crucial, and (iii) 2D substrates must be cost competitive. As a further consideration, the surface of van der Waals slabs may need to be activated so that there are dangling bonds to achieve nucleation and growth.

Exemplary embodiments of the invention use $Bi_2Se_3$ as a layered material for application as a substrate for eventual III-V growth. Phase-pure single crystal boules of $Bi_2Se_3$ were grown with the Bridgman method and exfoliation procedures were developed to yield macroscopic ($cm^2$) slabs of $Bi_2Se_3$. The resulting slabs were studied by a combination of diffraction and scanning probe methods to assess their surface morphology as a function of exfoliation number from a given crystal. These substrates and their mechanical handles are fully compatible with III-V growth chambers and preliminary cost analysis indicates their viability for single junction, one-sun III-V growth.

Disclosed herein are exemplary embodiments of the invention provide methods of exfoliating thin slabs of lattice-matched single crystals for textured and epitaxial growth. These methods use low-cost mechanical exfoliation of 2D single crystals by adhesion to a handle layer. The slabs are produced by adhering an exposed face of a bulk 2D single crystal to a low-cost rigid handle using an adhesion layer. Once the handle is adhered to the crystal, slab exfoliation is achieved by applying locally generated forces in the vicinity of the handle. The exfoliation may be performed by any suitable method, such as mechanical force, thermal expansion/contraction, intercalation-induced chemical pressure, or microtome cutting. This handle attachment/exfoliation process yields a fresh single crystal surface that remains atomically flat and is suitable for epitaxy. As such, the handle attachment/exfoliation process can be repeated to produce hundreds of atomically flat 2D substrates that are attached to handles. Further, the rigid handle may be used as a thermally stable mechanical support during the subsequent epitaxy of III-V semiconductors on top of the exfoliated 2D substrates. Because the exfoliated slabs are compatible with III-V growth chambers without any additional transfers, the exfoliated slabs may be used as substrates to grow III-V materials. For example, $Bi_2Se_3$ and $In_2Se_3$ are lattice matched to InP and GaAs.

In one exemplary embodiment of the invention, single crystal $Bi_2Se_3$ is exfoliated for the growth of lattice-matched and near-lattice-matched III-V semiconductors. Thin slabs of macroscopic (1 cm diameter) layered single crystal $Bi_2Se_3$ may be exfoliated onto glass using molten indium as the adhesion layer. The slabs may include any suitable number of layers of the single crystal material. Exemplary embodiments of the invention exfoliate multilayer slabs of excellent crystal quality and very large size from an initial bulk single crystal. The slabs may be single crystal material that spans an entire square-cm slab.

In one example, mechanical force is used to induce the exfoliation. As shown in FIG. 3(f), asymmetric pressure may be applied to a corner of the top handle, such that the side of the crystal closest to the corner is under compressive strain, while the side of the crystal farthest from the corner is under tensile strain. In this example, the crystal typically cleaves approximately 100 µm from the top handle. After semiconductor growth the handle can be cleaned and reused for subsequent exfoliations. Layered single crystals of $Bi_2Se_3$ may be obtained by any suitable method, such as the Bridgman crystal growth method. Further, various 2D materials having a wide variety of crystal structures and lattice parameters may be used, many of which are lattice-matched to a variety of bulk materials of interest. This technique could be modified for higher temperatures by using tin or zinc as the adhesion layer and molybdenum or silicon as the handle layer instead of glass.

Beyond epitaxial growth on well-lattice matched crystals, these substrates can be used to promote highly textured growth of non-lattice matched materials. For example, CdTe has been grown on layered single crystal $NbSe_2$ (grown via chemical vapor deposition) despite a 33% lattice mismatch, which suggests that the lattice matching constraint is less applicable for growth on 2D materials. Thus, using this exfoliation method could enable inexpensive single crystal substrates for use across the field of materials science.

The widespread deployment of GaAs-based photovoltaics depends critically on reduction of costs, particularly those stemming from the single crystal substrate. Exemplary embodiments of the invention provide low cost substrates obtained via exfoliation of layered, van der Waals bonded single crystals. Several model materials (e.g. GeS, SnS, $In_2Se_3$ and $Bi_2Se_3$) are lattice matched to III-V compounds and have exfoliation energies. Single crystals of $Bi_2Se_3$ were examined using X-ray reciprocal space maps, Auger spectroscopy, low-energy electron diffraction, and X-ray photoelectron spectroscopy. From these bulk single crystals, atomically flat, macroscopic slabs (>1 $cm^2$) were exfoliated using an indium-bonding technique. Atomic force microscopy (AFM) reveals that the slabs have an average RMS roughness of 0.04 nm across 400 $mm^2$ scans and an average terrace length of 72 mm between step edges. 2D X-ray diffraction and reciprocal space maps confirm the high crystalline quality of the exfoliated surfaces. This exfoliation method produces substrates fully compatible with high-temperature growth processes used to grow III-V films. Exemplary embodiments of the invention provide a foundation for the widespread study and development of exfoliated layered materials as epitaxial substrates for III-V photovoltaic development.

Figure 2:
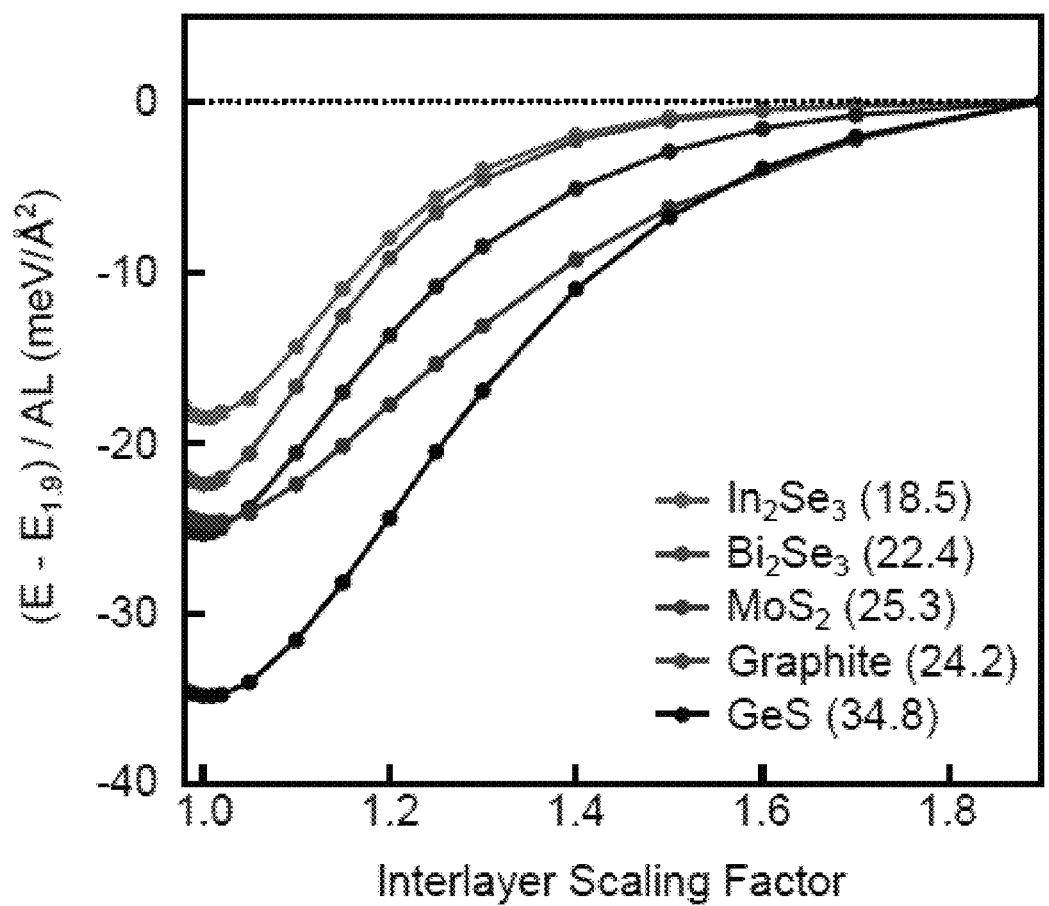
FIG. 2 depicts the exfoliation energies of the van der Waals crystals Bi$_2$Se$_3$, In$_2$Se$_3$ and GeS. These compounds have similar exfoliation energies to graphite and MoS$_2$, well-known layered materials that can be exfoliated with relative ease. These calculations consider the energetics as the van der Waals gap is scaled relative to the equilibrium distance, termed the interlayer scaling factor. The exfoliation energy is estimated from the difference between the equilibrium energy (E1.0) and the energy at an interlayer scaling factor of 1.9 (E1.9), and normalized by the number of van der Waals gaps (L) and the surface area (A) within the unit cell. The number in parenthesis is the exfoliation energy in meV.

First-principles density functional theory (DFT) calculations were performed with plane-wave VASP code to construct the exfoliation curves shown in FIG. 2. To account for long-range van der Waals (vdW) interactions in quasi-2D layered materials, the optB86 vdW corrected functional was employed. The structures were relaxed with the vdW corrected functional using a plane-wave energy cut-off of 340 eV. Previously, it was demonstrated that total energy calculations with the optB86 functional reproduce the lattice parameters and elastic properties such as bulk modulus of quasi-2D materials in fairly good agreement with experiments. To construct the exfoliation curves (FIG. 2), the inter-layer distance in the quasi-2D structure was scaled up to mimic the process of pulling the layers of the bulk crystal apart. A scaling factor of unity corresponds to equilibrium. The inter-layer spacing was scaled down to 0.98 of the equilibrium distance to accurately capture the energy well. At a scaling factor of 1.9, the inter-layer interactions become negligible, as indicated by the plateauing of the total energies (denoted by $E_{1.9}$). The total energies with respect to $E_{1.9}$ are normalized by the number of layers (L) and the surface area (A) in the unit cell and are plotted as a function of the inter-layer scaling factor in FIG. 2. The exfoliation energy ($E_{exfol}$) is calculated as $E_{exfol}=E1.9-E1.0/(L\times A)$ for each layered material examined.

To ensure chemical homogeneity and to suppress formation of Se vapor during growth, polycrystalline $Bi_2Se_3$ was prepared prior to Bridgman growth of single crystals. The precursor was generated by sealing stoichiometric amounts of Bi shot (UMC 99.9999%) and Se shot (Alfa 99.999%) in a cleaned and baked fused silica ampoule. The material was heated to 800° C. at a rate of 100° C./hr and held for 24 h at 800° C., then cooled and powdered. Phase purity was assessed using powder X-ray diffraction (XRD). The resulting $Bi_2Se_3$ powder was sealed under vacuum in a tapered 10 mm diameter fused silica ampoule and placed in a home-built Bridgman crystal growth setup. The ampoule was soaked at 850° C. for 24 h and consequently lowered at a rate of 3 mm/hr through a temperature gradient of 10° C./cm. To facilitate handling and exfoliation, the single crystal boule was mechanically partitioned into smaller ingots.

Phase purity and crystallinity of the partitioned ingots was assessed with a Bruker D8 Discover equipped with an area detector. To specifically probe surface structure and composition, low-energy electron diffraction (LEED) and Auger electron spectroscopy were conducted on freshly exposed surfaces. X-ray photoelectron spectroscopy (XPS) was performed on a PHI Electronics 5600 setup using Al Kα monochromatic X-rays (1486.7 eV).

Figure 3:
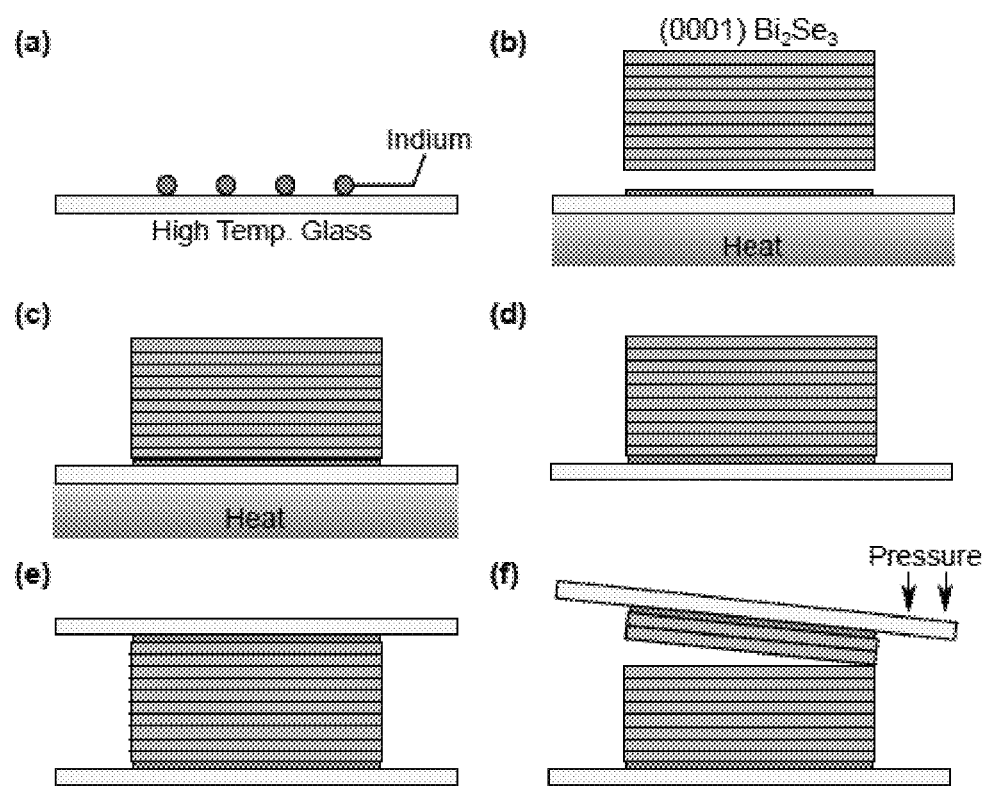
FIG. 3 depicts the indium-bonded exfoliation process which utilizes high-temperature glass as a rigid 'handle.' (a) Indium shavings are first placed on high-temperature glass. (b-c) The glass is placed on a hot plate, and once the indium is molten, single crystal Bi$_2$Se$_3$ is firmly pressed onto the indium. (d) This multilayer stack is allowed to cool, leaving the crystal adhered to the handle. (e) A handle is adhered to the other side of the single crystal using the same method. (f) Pressure is applied to an edge of the top handle, transferring force into the crystal for crack formation and propagation. The crystal repeatably cleaves 40-150 µm from the top.

Exfoliation of single crystal slabs was performed in an argon glove box with <5 ppm moisture and <10 ppm oxygen. The process of indium-bonded exfoliation is illustrated in FIG. 3. Shavings of indium were placed on glass slides and heated to >200° C. on a hot plate. Once the indium was molten, the (0001) $Bi_2Se_3$ single crystal ingot face was firmly pressed onto the indium. The process was repeated on the other side of the crystal ingot to form a symmetric stack of glass-$Bi_2Se_3$-glass mechanically bonded with solid indium. To cleave the crystal, gentle compressive, asymmetric pressure was applied to the edge of the top glass slide. This process was repeated multiple times to generate numerous single crystal slabs.

To assess the crystallinity of the exfoliated slabs, both ω-2θ scans and reciprocal space maps were conducted using the previously mentioned Bruker D8 Discover and a high resolution PANalytical X'Pert Pro, respectively. Tapping mode atomic force microscopy (AFM) was conducted with an Asylum Research system to assess surface morphology. An aluminum reflex coated silicon probe with a 5 N/m force constant and 120 kHz resonant frequency was used, as these materials prove to be quite soft.

Identification of layered materials amenable to epitaxial growth requires balancing a suite of design criteria (e.g. growth, stability, lattice parameter). Among the most promising for III-V substrates were GeS, $In_2Se_3$, and $Bi_2Se_3$. Calculations were performed in order to compare exfoliation energies of the candidate materials. FIG. 2 shows the potential energy wells that bind these solids together. The calculated $E_{exfol}$ for $Bi_2Se_3$, $In_2Se_3$, and GeS are 22.4, 18.5, and 34.8 meV/Å$^2$. These candidate materials have exfoliation curves and binding energies similar to those of graphite and $MoS_2$ (respectively 24.2 and 25.3 meV/Å$^2$), two well-known layered materials. Wang et al. report an experimental cleavage energy value of 24.3 meV/Å$^2$ for graphite, which is consistent with our calculation. This indicated that the candidate materials can be exfoliated with methods comparable to standard methods used for graphite and $MoS_2$.

Selection of $Bi_2Se_3$. $Bi_2Se_3$ was identified as the most promising candidate for initial investigation. $Bi_2Se_3$ melts congruently and undergoes no high temperature structural phase transitions, which is ideal for the Bridgman growth process. GeS, while attractive from the perspective of lattice constant, has several high temperature phase transitions that make Bridgman growth challenging. The (0001) $Bi_2Se_3$ surface forms a hexagonal net that is 0.04% mismatched to the (111) face of InP and 3% mismatched from that of GaAs. $Bi_2Se_3$ was selected as a model material to demonstrate proof of concept substrate usage for InP growth, while follow-up investigations aim to apply the exfoliation method to layered materials lattice-matched to GaAs.

Figure 4:
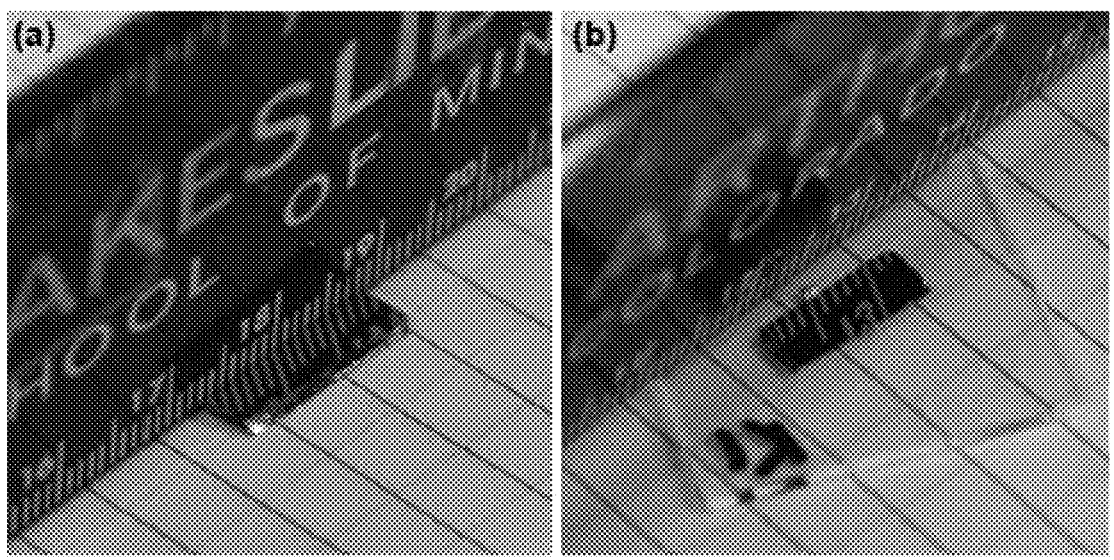
FIG. 4 depicts images of (a) a bulk Bi$_2$Se$_3$ crystal and (b) a slab of Bi$_2$Se$_3$ exfoliated using the indium-bonded method. The high-temperature glass handle, which provides structural support during the exfoliation process, is visible in (b). Both crystals exhibit mirror-flat surfaces exhibiting the specular reflection of a ruler.

Single crystal growth. $Bi_2Se_3$ single crystals have previously been grown by a diverse array of methods; in this work the Bridgman method was used as it is proven to yield large diameter boules (>1 cm) and is compatible with the high vapor pressure of chalcogenides. To prepare feedstock for Bridgman growth, polycrystalline $Bi_2Se_3$ was synthesized from the elements and confirmed to be phase pure by powder XRD. Single crystal boules (10 mm diameter×30 mm length) grown by Bridgman were a homogeneous silvery-gray color with neither cracks nor inclusions visible on the boule surface. Boules were easily sectioned into single crystal ingots along the (0001) plane due to the van der Waals nature of the layered bonding. FIG. 4a shows the specular reflection of a ruler on a sectioned single crystal of $Bi_2Se_3$.

Figure 7:
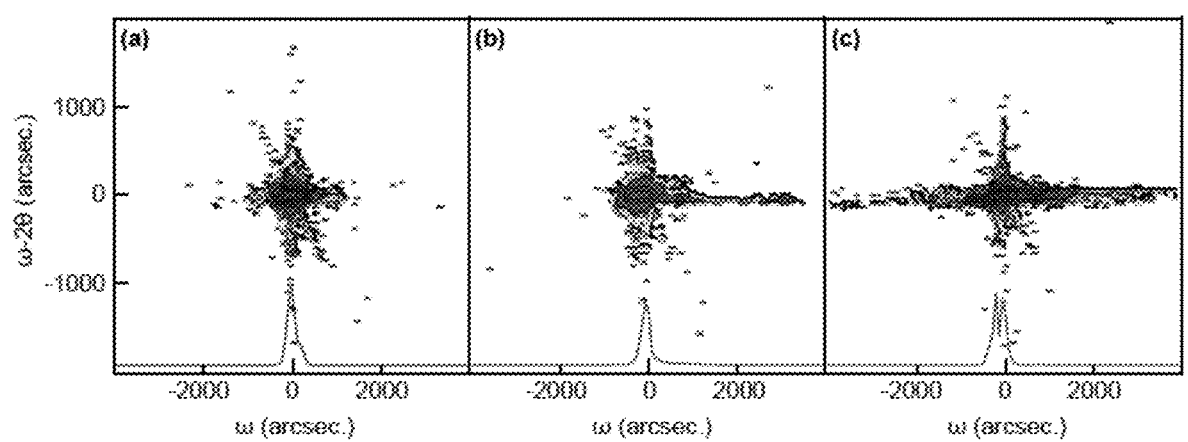
FIG. 7 depicts reciprocal space maps on a logarithmic scale of the (0006) peak of a Bi$_2$Se$_3$ sample (a) before and (b-c) after indium-bonded exfoliation demonstrate that exfoliation only mildly impacts crystalline quality. (b) and (c) were taken on different regions of the same exfoliated sample. The exfoliated peaks remain narrow, with a small amount of broadening introduced by the macroscopic bowing of the sample. Insets show line scans at ω-2°=0°, which have FWHM values of 216, 226, and 360 arcseconds, respectively. However, the line scan in (c) consists of two distinct peaks, each with significantly smaller FWHM values (120 20 and 162 7 arcseconds). This suggests exfoliation causes macroscopic domains due to slight bending in the crystal.

Characterization of the boule. To assess the crystallinity of the as-grown crystals, ω-2θ and reciprocal space mapping were con-ducted on a freshly exposed surface. Only the {0001} family of planes is present, consistent with the layered crystallography of $Bi_2Se_3$. The reciprocal space map reveals a FWHM of 216±arcsecs for the (0006) peak (FIG. 7a). This value is an order of magnitude larger than typically observed in thin film III-Vs, which is attributed to the highly compliant nature of these crystals due to inter-layer glide.

Figure 5:
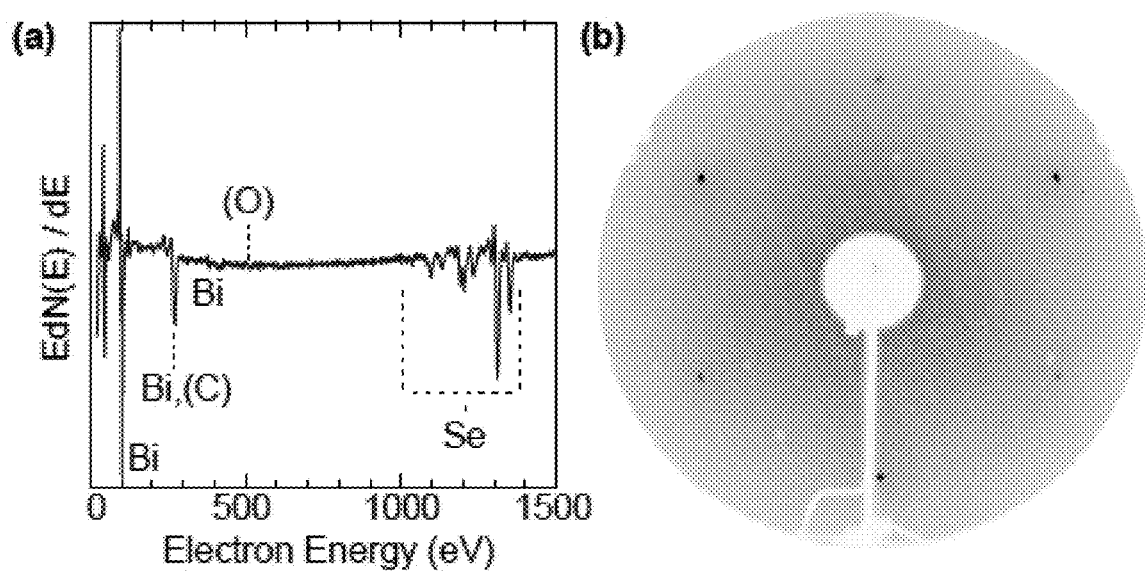
FIG. 5 depicts (a) differentiated 5 kV Auger electron spectroscopy (AES) scan was performed on Bi$_2$Se$_3$ cleaved in air, then loaded into a UHV chamber for analysis. No oxygen peak is seen here, and no carbon (obscured by Bi in AES) was seen in XPS (FIG. 9). (b) Low-energy electron diffraction (LEED). Images show the expected 3-fold rotational symmetry. The LEED image shown here was taken at 40 eV.
Figure 9:
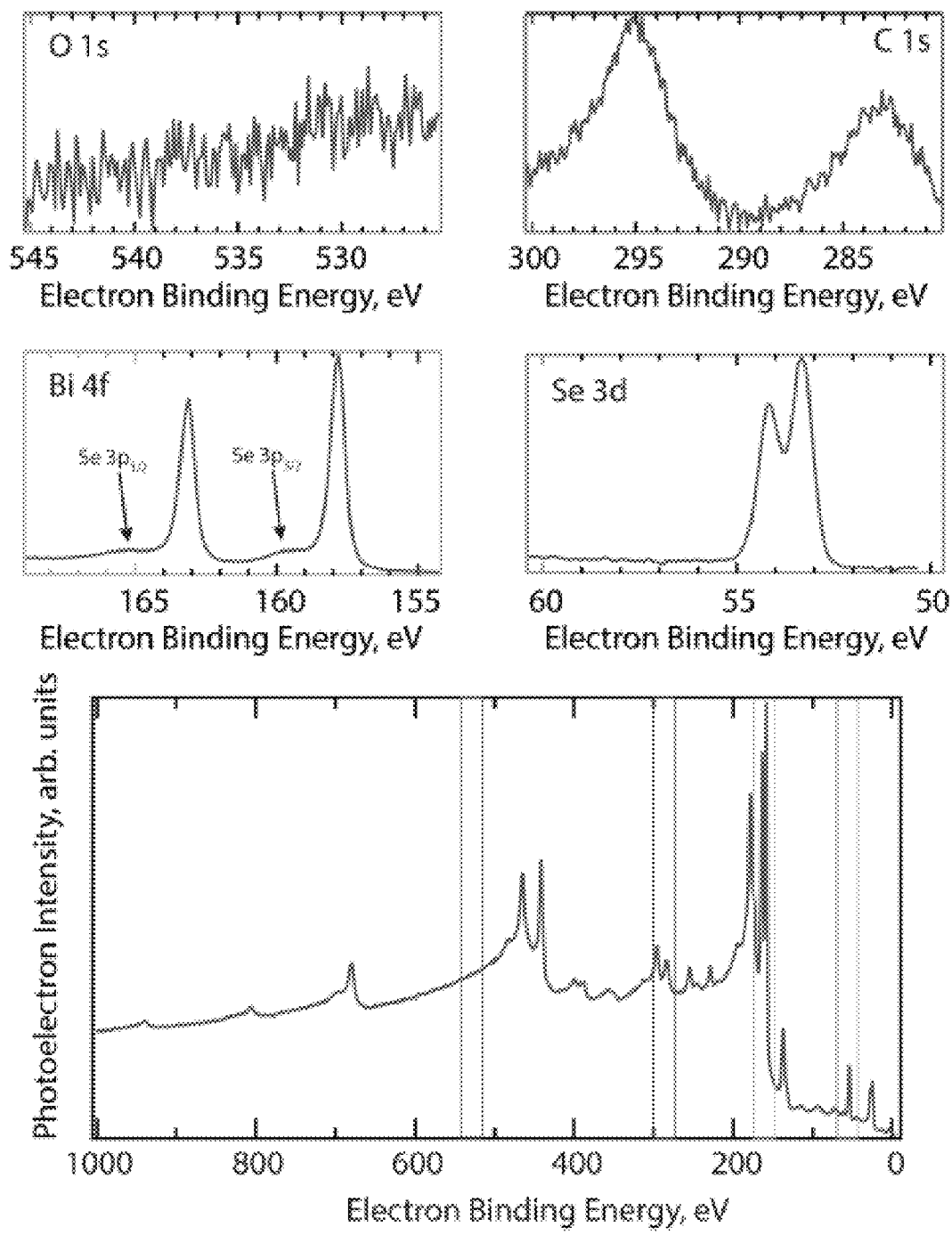
FIG. 9 depicts X-ray photoelectron spectroscopy of Bi$_2$Se$_3$. The bottom spectrum is the low-resolution survey spectrum. Only Bi and Se are detected. Within the survey spectrum, the colored boxes indicate regions where high-resolution spectra were taken. There is no O 1s signal detected (green box). In the region of the C 1s region (blue box), the intensity is due to Auger lines from Se. In the Bi 4f region (orange box), there is also overlap from Se 3p, which is identified. There is clear signal from Se 3d region (pink box). The surface ratio of the of the Bi:Se as detected by XPS is Bi$_2$Se$_{2.5}$, which is close to the expected value.

To characterize the atomic structure of the surface, a bulk single crystal with a freshly exfoliated surface was loaded into a UHV chamber for analysis with Auger electron spectroscopy (AES) and low-energy electron diffraction (LEED). The surface was free of oxygen and carbon, consistent with prior reports for an ideal, Se-terminated cleave. The lack of oxygen contamination is readily apparent in the AES scan in FIG. 5a, but the carbon AES peak can be obscured by Bi, so XPS (FIG. 9) was performed to verify the lack of carbon contamination. LEED data (FIG. 5b) exhibits the expected 3-fold rotational symmetry and is crisp and clear, consistent with a high-quality Se-terminated cleave.

Exfoliation. A variety of $Bi_2Se_3$ exfoliation strategies were explored, the three main categories of which are termed 1) unsupported mechanical cleaving, 2) unsupported and supported adhesive exfoliation, and 3) supported metal-bonded exfoliation. With unsupported mechanical cleaving, a sectioning microtome was used to cleave $Bi_2Se_3$ along the (0001) plane. The main challenge associated with this technique was the need for atomic-scale alignment of the blade to prevent cutting through the layers. This technique did not yield suitable substrates for epitaxial growth due to scrolling of the exfoliated layer, which yielded tubes rather than sheets.

The next method examined, unsupported adhesive exfoliation, builds upon the traditional tape exfoliation of graphene. Tape was adhered to a single crystal and then peeled off, yielding thin slabs of $Bi_2Se_3$. The resulting crystals exhibited a large amount of cracking, bending, and surface debris due to the soft nature of the material. Without a rigid support during the mechanical cleaving process, the unsupported method would yield slabs unusable for epitaxial growth due to their degraded quality and small area.

To eliminate bending of the exfoliated slab and provide a more directed stress profile within the propagating crack tip, mechanically supported exfoliation was tested. In this approach, symmetric stacks were formed by adhering double sided tape to both (0001) faces of a single crystal and capping the stack with glass slides. When compressive pressure was applied to one side of the glass, the crystal would reproducibly cleave along the (0001) planes close to the side from which pressure was applied. This cleavage would occur rapidly and propagate across the entire crystal, rather than the slower release associated with the tensile exfoliation discussed above. A structural support was used on both sides to avoid deformation and serve as a handle for the exfoliated slab.

Exemplary embodiments of the invention use a metallic adhesive in order to produce substrates that are thermally robust. Supported indium-bonded exfoliation, as described in the experimental section, overcomes the poor thermal stability of tape and yields similar quality $Bi_2Se_3$ slabs. Indium is often used as a substrate mounting method in molecular beam epitaxy systems, so this method is fully compatible with III-V growth systems without additional processing. For a 1 mm thick $Bi_2Se_3$ crystal, up to 11 atomically flat, single crystalline, exfoliated slabs with lateral dimensions of 10 mm have been obtained (slabs are generally 40-150 µm thick). FIG. 4b shows the exfoliated square-centimeter slab and the specular nature of its surface as demonstrated with the adjacent ruler.

Figure 6:
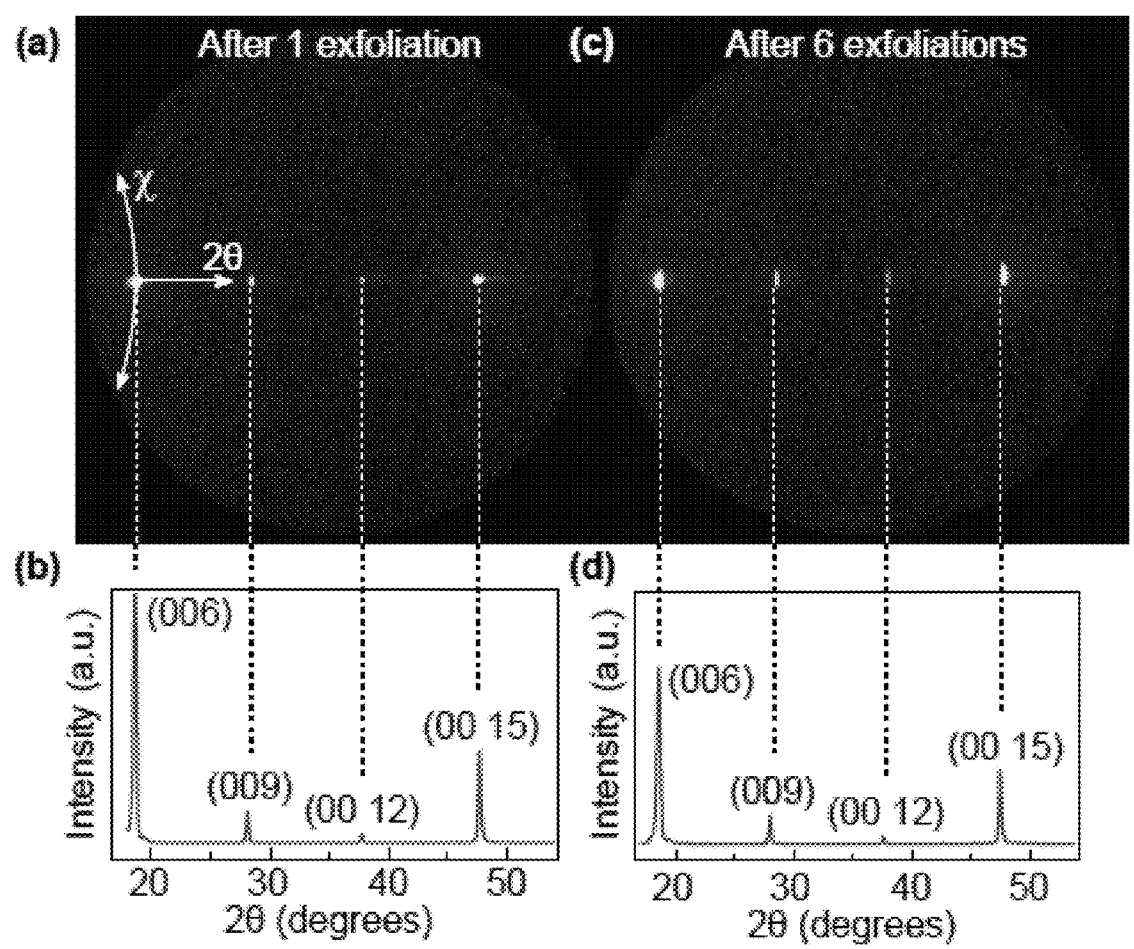
FIG. 6 depicts 2D XRD scans of the (a) first and (c) sixth Bi$_2$Se$_3$ exfoliated slabs show the 0001 family of reflections, indicating the slabs retain the single crystal character of the parent bulk crystal. (b) and (d) show XRD data from (a) and (c), respectively, integrated in χ. This data is consistent with ω-2θ scans of parent Bi$_2$Se$_3$.

XRD. After using supported indium-bonded exfoliation to produce single crystalline slabs, XRD was again performed to verify that the crystallinity was not impacted by exfoliation. 2D diffraction patterns of the exfoliated slabs were largely unchanged from those of the bulk crystal, with only slight broadening in $\chi$ after six exfoliations, as shown in FIG. 6. Reciprocal space maps (FIG. 7b-c) reveal FWHM values of 226±3 and 360±30 arcsecs for the (0006) peak, which is fairly consistent with the original crystal, with minor degradation associated with the flex of the samples. For the sample region shown in FIG. 7c which exhibits a larger spread in ω, multiple overlapping peaks are observed, suggesting macroscopic domains arising from slight bending in the crystal during the exfoliation process. However, each peak retains a narrow FWHM value, which implies that local crystalline quality is maintained. Increased automation in the exfoliation process may eliminate such bending.

Surface morphology and composition. AFM was performed to assess the surface morphology of exfoliated slabs of $Bi_2Se_3$ and to ensure repeated exfoliations do not degrade surface quality. Step edges (FIG. 8a) are occasionally found by AFM; these exhibit the approximately 10 Å height associated with a single 5-atom-thick slab (FIG. 8b).

Figure 8:
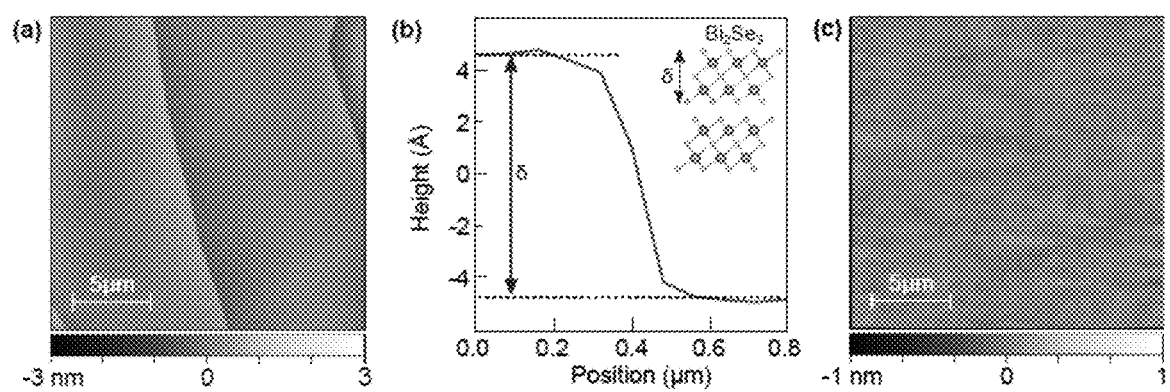
FIG. 8 depicts atomic force microscopy (AFM) was used to characterize the roughness of the exfoliated slabs of Bi$_2$Se$_3$. (a) While the majority of exfoliated slabs have RMS roughnesses <0.06 nm, occasionally we observe step edges. (b) The step edge in (a) is 1 nm high, consistent with the layered crystallography of Bi$_2$Se$_3$. Specifically, the step edge corresponds to the spacing between van der Waals layers (inset). (c) After six exfoliations, this AFM scan of a slab of Bi$_2$Se$_3$ produced using the indium-bonded exfoliation method demonstrates the highly flat nature of these slabs. The small variations in color are due to noise and are not features on the sample surface. This is the same crystal on which 2D XRD is shown in FIG. 6. Additional AFM scans of exfoliated crystals are shown in FIG. 10.
Figure 10:
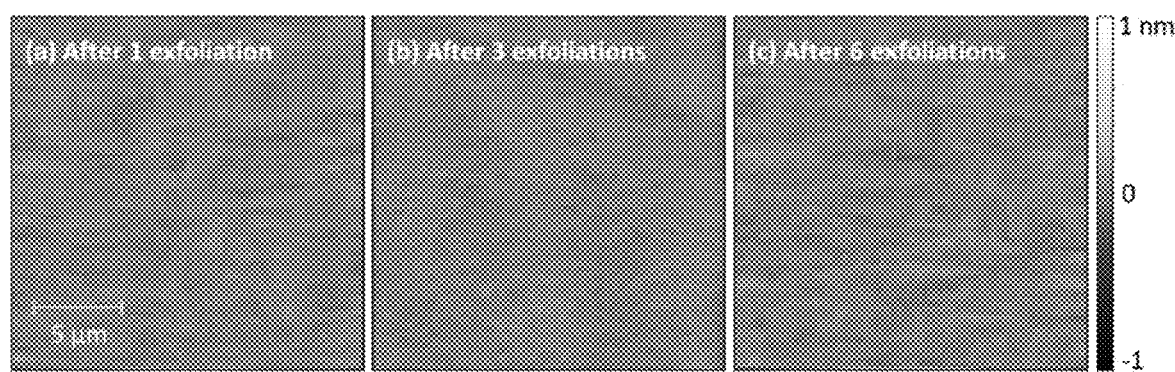
FIG. 10 depicts 20 µm×20 µm AFM scans of Bi$_2$Se$_3$ slabs produced from (a) one (b) three and (c) six exfoliations show extraordinarily flat surfaces, with RMS roughnesses of 0.040, 0.039 and 0.043 nm respectively.

FIG. 8c shows a 20×20 µm scan of an exfoliated slab after six exfoliations. This scan exhibits an RMS roughness of 0.043 nm, which is extraordinarily flat. For reference, a typical wafer for growth after chemical-mechanical polishing exhibits RMS roughness of over an order of magnitude greater than the samples. FIG. 8c utilizes a heat map spanning 2 nm, the height of two 5-atom steps in the crystal structure of $Bi_2Se_3$. Additional scans of exfoliated slabs from the same crystal exhibiting RMS roughnesses of 0.040 nm and 0.039 nm are shown in FIG. 10.

Figure 11:
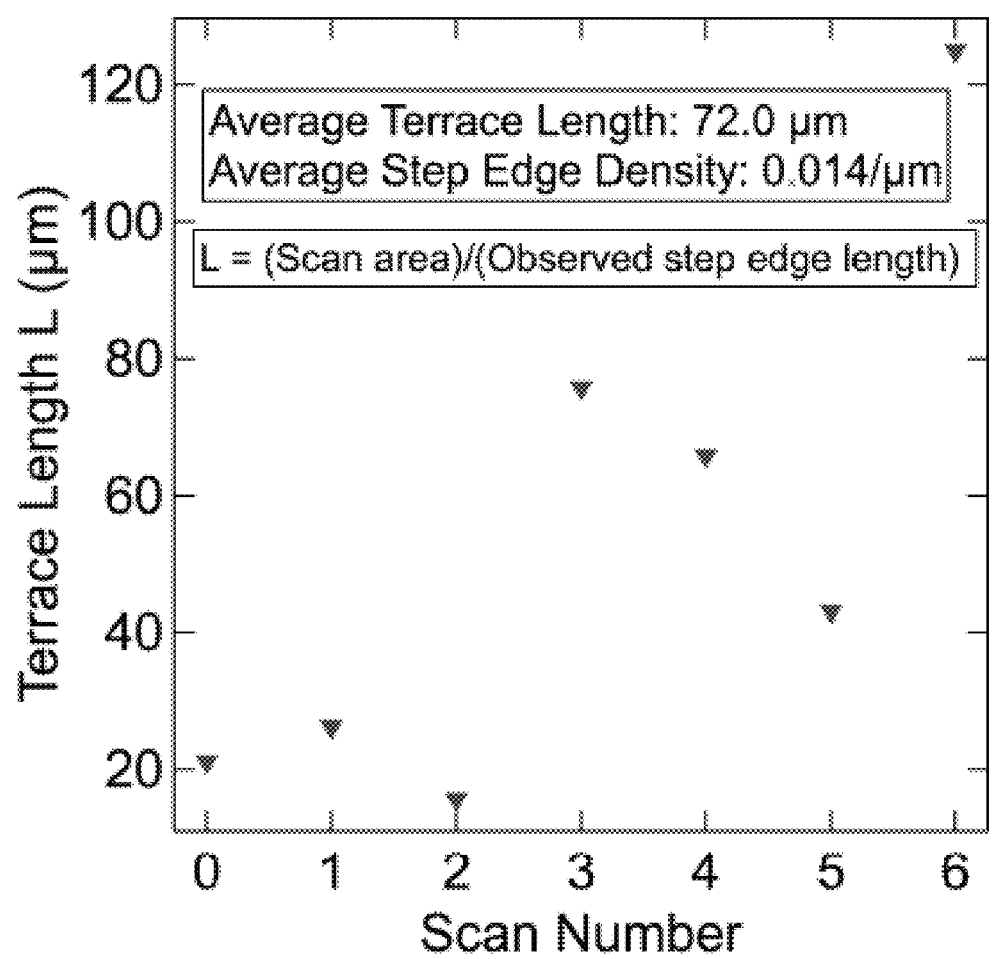
FIG. 11 depicts fifteen large-area AFM scans were performed on exfoliated samples to collect data regarding step edge frequency. Eight of the fifteen scans exhibited no step edges at all. The step edge length per scan was used to calculate a terrace length L, which represents the average distance between step edges (modeling the step edges as parallel). The average step edge density was 0.014 µm$^{-1}$ and the average terrace length was 72.0 µm.

To assess the density of step edges, wider area AFM scans were performed on multiple exfoliated samples. By conducting fifteen random 50 µm×50 µm scans, a step edge density of 0.014 µm$^{-1}$ was obtained (FIG. 11). Eight of the fifteen total 2500 µm$^2$ scans exhibited no step edges at all. The step edge density was inverted to yield a value of 72 µm, which represents the average length between each step edge under the assumption that they are parallel. This low step edge density and long terrace length suggests that the propagation of the crack tip during exfoliation was exceptionally well-confined within a given inter-layer gap, producing near-atomically flat exfoliated surfaces. Ongoing work seeks to manipulate step edge density on these exfoliated surfaces and use step edge sites as nucleation centers.

Commercial potential. Exfoliated 2D materials have the potential to dramatically lower the cost of substrates for III-V epitaxy. The spot prices of elemental bismuth and selenium were used to calculate the cost of precursors for $Bi_2Se_3$ single crystals. The elements present in a ~250 µm thick exfoliated slab are cost equitable with current Si wafer prices. Further refinement to the exfoliation process may drive the slab thickness well below the <80 µm current average thickness and thus represents a negligible contribution to the cost. Instead, cost analysis will need to explore the cost of the mechanical substrate, bonding materials, and the single crystal growth and exfoliation processes. As little is known about the commercial aspects of exfoliation, a full cost analysis is presently overly speculative.

Beyond low cost, exfoliated van der Waals substrates exhibit other commercially relevant traits. The substrates are highly compliant compared to other III-V substrates, potentially enabling flexible electronics. Due to the weak adhesion, deposited films may be mechanically removed from their substrate. The ease of this removal would facilitate back-side contacts and mechanically stacked architectures. Beyond serving as substrates for III-V growth, such exfoliated slabs can serve as macroscopic templates for the growth of 2D monolayers and more exotic structures (e.g. multilayers, laterally modulated structures).

Exemplary embodiments of the invention provide a technique for exfoliating large-area, atomically-flat slabs from bulk 2D crystals to serve as substrates for III-V growth. Bulk single crystalline $Bi_2Se_3$, a layered material lattice-matched to (111) InP, was grown using the Bridgman method. An exfoliation method was developed to produce 40-150 µm thick substrates attached to high temperature glass handles via metallic indium. The crystallinity of these macroscopic (1 cm$^2$) slabs was maintained after exfoliation as determined by 2D XRD and reciprocal space maps. Surface quality was analyzed using AFM and these exfoliated substrates were found to be highly smooth, with RMS roughnesses of ~0.04 nm in 20×20 µm regions after six exfoliations. Low step edge densities of 0.014 µm$^{-1}$ emphasize the highly directed crack propagation within the van der Waals gap. The indium-bonded technique produced substrates fully compatible with a III-V growth chamber. These findings pave the way to the widespread study of low-cost layered substrates for epitaxial III-V growth.

Wide-scale deployment of III-V solar cells with efficiency greater than 30% has been constrained by the cost of single-crystal substrates. Ongoing work to mitigate this cost has ranged from homoepitaxy combined with substrate recycling to heteroepitaxy on lower-cost substrates like silicon. The latter adds the complexity of attempting to overcome lattice mismatch, for which techniques such as lateral epitaxial overgrowth and metamorphic buffer layers are being developed. Another approach is substrate reuse, for example by spalling, which can provide many epitaxial growths using a single substrate, but must still overcome costly cleaning steps and wafer re-polishing. As an alternative, exemplary embodiments of the invention use layered van der Waals materials to serve as low matched substrates (FIG. 1).

Exemplary embodiments of the invention use $Bi_2Se_3$ as a model material to demonstrate production of layered substrates. Large phase-pure single crystal boules of $Bi_2Se_3$ were grown with the Bridgman method. Using an indium-bonded exfoliation method, large-area layered substrates were produced and then examined with diffraction and scanning probe methods. These substrates were found to have RMS roughnesses of 0.04 nm in 20×20 μm regions, and to exhibit an average terrace length of 72 μm. Thicknesses of 40-160 μm were determined using SEM. These substrates are fully compatible with III-V growth chambers, paving the way to low-cost van der Waals epitaxy of III-Vs.

Crystal growth processes and the indium-bonded exfoliation technique are described above. $Bi_2Se_3$ single crystals were grown in a custom Bridgman crystal growth setup. Ampoules were soaked at 850° C. for 24 h and consequently lowered at 3 mm/h through a temperature gradient of 10° C./cm. To facilitate handling and exfoliation, single crystal boules were mechanically partitioned into smaller ingots. Phase purity and crystallinity of the ingots was assessed with a Bruker D8 Discover equipped with an area detector.

Exfoliation of single crystal slabs was performed in an argon glove box with <5 ppm moisture and <10 ppm oxygen. Shavings of indium were heated on glass slides until molten, and then a [0001] face of a $Bi_2Se_3$ ingot was firmly pressed onto the indium. The whole assembly was allowed to cool, leaving the crystal face mechanically bonded to the glass slide. The process was repeated on the other side of the crystal ingot to form a symmetric stack of glass-indium-crystal-indium-glass. Gentle application of compressive, asymmetric pressure to the stack cleaved the crystal. This process was repeated multiple times to generate numerous single crystal slabs.

Exfoliated slabs were characterized with the previously mentioned Bruker XRD system and with tapping mode atomic force microscopy (AFM) using an Asylum Research system. An aluminum reflex coated silicon probe with a 5 N/m force constant and 120 kHz resonant frequency was used, as it was found that a higher force constant tip would damage the sample surfaces. SEM was performed using a FEI Quanta 600I SEM with a 25 keV accelerating voltage. Additional diffraction and surface characterization techniques were explored above.

Figure 12:
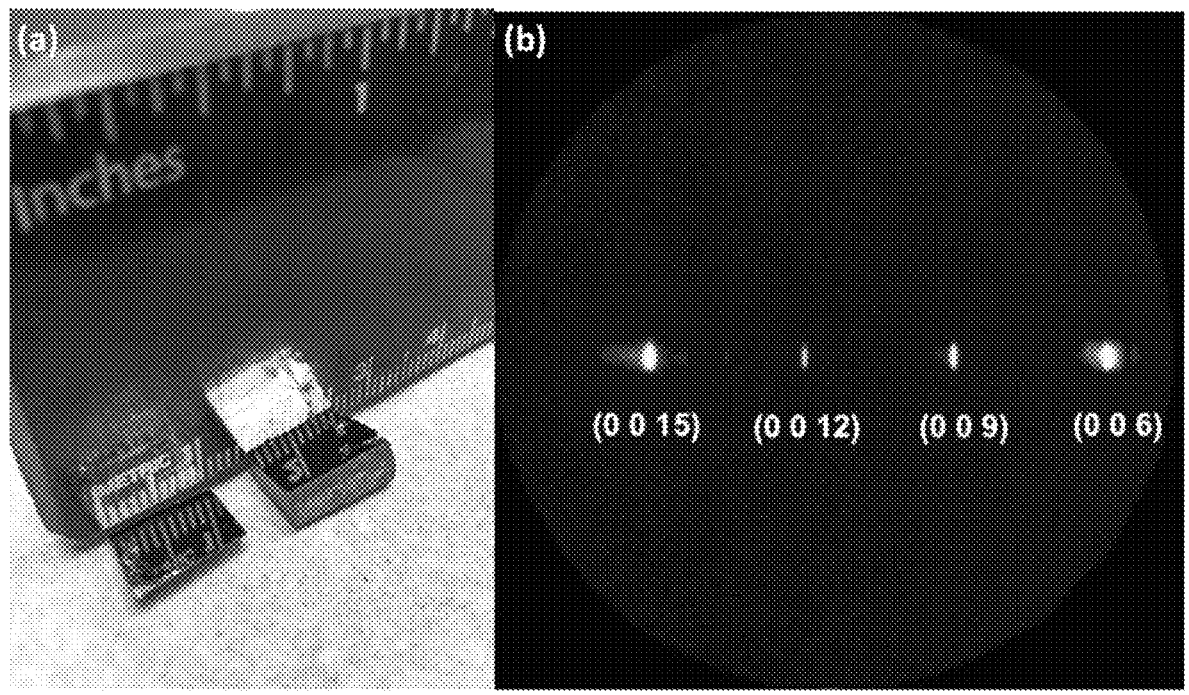
FIG. 12 depicts (a) Bulk single crystals of Bi$_2$Se$_3$ grown using Bridgman exhibit highly specular surfaces, demonstrating their layered nature. (b) XRD scans of bulk single crystals Bi$_2$Se$_3$ using a 2D detector show only the [0001] family of planes with all peaks aligned in chi, co single crystal. Scans are taken from 18 to 54 degrees 2-theta.

Bulk $Bi_2Se_3$ single crystals were easily sectioned parallel to their layered planes and were found to have highly specular surfaces (FIG. 12a). Crystals were characterized with 2D XRD and found to exhibit only the [0001] family of planes consistent with the R$\bar{3}$m structure. Alignment of all peaks in chi showed that high-quality single crystalline material was produced, see FIG. 12b.

The process of indium-bonded exfoliation, described in the experimental section, was used to exfoliate these bulk single crystals. With a millimeter-thick source crystal of $Bi_2Se_3$, up to 11 exfoliated slabs of $Bi_2Se_3$ (40-160 μm thick) with lateral dimensions of 10 mm have been produced. AFM was performed immediately after exfoliation to assess surface quality. Scans performed on a sample after 6 exfoliations demonstrate RMS roughnesses of 0.04 nm, which is extraordinarily flat for a sample processed in a glove box yet transported in air. For reference, a typical wafer for growth after chemical-mechanical polishing exhibits RMS roughness of over an order of magnitude greater than our samples.

Figure 13:
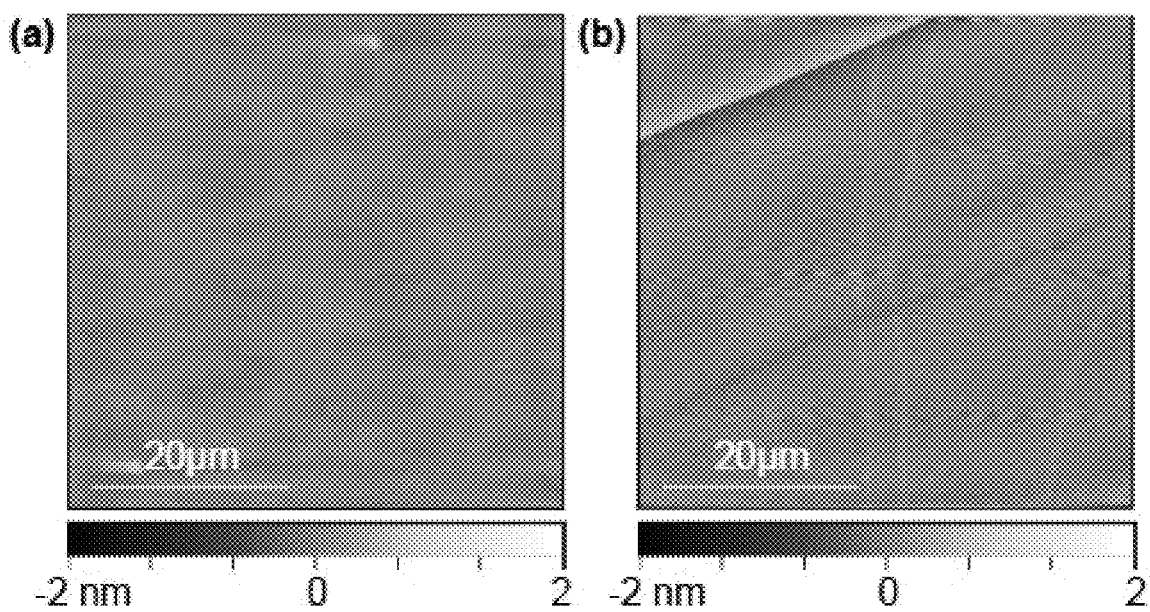
FIG. 13 depicts 50 µm×50 µm AFM scans were performed on Bi$_2$Se$_3$ exfoliated using the indium-bonded method to assess the density of step edges. Eight of the fifteen total large-area scans exhibited no step edges at all, such as the scan shown in (a). Occasionally a 1 nm step edge is observed such as the one shown in (c), which is the height of a single quintuple-atom layer in the crystal structure. The texture exhibited in the data is residual high frequency noise and is not actually present on the sample.
Figure 14:
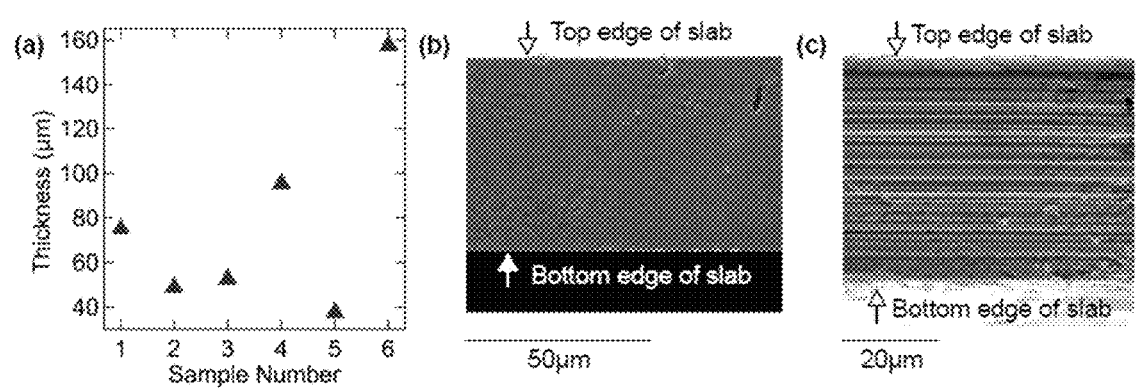
FIG. 14 depicts cross-sectional scanning electron microscopy (SEM) was used to measure the thicknesses of slabs of Bi$_2$Se$_3$ exfoliated using the indium-bonded method and then removed from the glass handle. (a) The distribution of thicknesses of $Bi_2Se_3$ samples produced by the indium-bonded method ranges from 40 to 160 microns as measured by SEM. Some exfoliated $Bi_2Se_3$ samples, such as (b), exhibited a clean and sharp cross-section, while others such as (c) exhibited striations that suggest layers were beginning to cleave apart near the edge of the crystalline slab.

Wider area AFM scans were performed on multiple exfoliated samples to assess the density of step edges. A step edge density of 0.014 $\mu m^{-1}$ was obtained by conducting fifteen random 50 μm×50 μm scans. Eight of these scans exhibited no step edges at all, such as that shown in FIG. 13a. Occasional 1 nm high step edges were observed, which is the height of a single quintuple-atom layer in the crystal structure of $Bi_2Se_3$ (FIG. 13b). The step edge density was inverted to yield a value of terrace length, or the average distance between each step edge assuming they are parallel. The terrace length is found to be 72 μm, which taken with the RMS roughness suggested that the propagation of the cleave between layers was very well confined within a particular interlayer gap. Though surfaces were found to be exceptionally flat given the fracture dynamics, we observed oxidation beginning to occur on exfoliated samples after 24 h in ambient conditions. Scanning electron microscopy (SEM) was used to determine thicknesses of $Bi_2Se_3$ slabs exfoliated using the indium-bonded method. Slabs were removed from the glass handle by melting the indium on a hot plate, and were then mounted vertically for cross-sectional SEM. SEM was performed on six different exfoliated slabs, and shows a thickness distribution of 40-160 μm (FIG. 14a). Some SEM scans, such as FIG. 14c, exhibit striations parallel to the (0001) surface, which suggests that the layers are beginning to cleave apart near the edge of the exfoliated crystal. Compressive and tensile strain on different parts of the crystal during the exfoliation process may contribute to this phenomenon.

In summary, exemplary embodiments of the invention provide a metal-bonded technique for exfoliating large-area, atomically-flat slabs from bulk 2D crystals. Bulk single crystalline $Bi_2Se_3$ was grown using the Bridgman method and its crystallinity was verified using XRD. An indium-assisted exfoliation method was used to produce eleven $cm^2$ substrates from one mm-thick single crystal. Surface quality was analyzed using AFM and these exfoliated substrates were found to be highly smooth, with an RMS roughness of 0.04 nm in 20×20 μm regions. An average terrace length of 72 μm between step edges was determined by AFM. Substrates have thicknesses ranging from 40-160 μm as determined by SEM. The indium-bonded technique produced substrates fully compatible with a III-V growth chamber. These findings pave the way to the widespread study of the use of quasi-2D substrates for epitaxial III-V growth.

Topotaxial Conversion of $Bi_2Se_3$ to $In_2Se_3$ by annealing under Trimethylindium. In an embodiment, disclosed are how the surface layers of layered-2D $Bi_2Se_3$ can be converted to layered-2D $In_2Se_3$ by annealing under a trimethylindium (TMIn) flux. Cross-sectional transmission microscopy shows complete layer-by-layer conversion to $In_2Se_3$ with excellent crystallinity. This conversion process could be utilized for two purposes: If only selected regions are converted by masking the surface to spatially define the TMIn exposure, then the difference in bandgap between $Bi_2Se_3$ and $In_2Se_3$ could be used to created lateral heterojunctions. The conversion may also have implications for heteroepitaxy, because the in-plane lattice constants of $Bi_2Se_3$ and $In_2Se_3$ (0001) surfaces match those of InP and GaAs (111), respectively. Furthermore, changing the lattice constant via gradual elemental substitution in 2D layers weakly bound to the underlying substrate may provide a pathway to very abrupt, dislocation-free, lattice constant changes, if the conversion occurs without rupturing the 2D layer.

In an embodiment, disclosed herein are improvements to and uses of 2D materials. As with any other material for optoelectronics, it is useful to be able to control the bandgap and lattice constant. For most materials, this is done epitaxially, i.e. for the III-V materials system, MJ PV is one example. For 2D materials it has been shown that this can be accomplished by converting the material.

Large single-crystals of 2D layered $Bi_2Se_3$ can be produced using Bridgman growth, and cleaved to produce nearly flawless $Bi_2Se_3$ (0001). These could be quite valuable for a variety of applications, but only if their properties can be selectively modified and/or if they can be combined with other materials.

Figure 15:
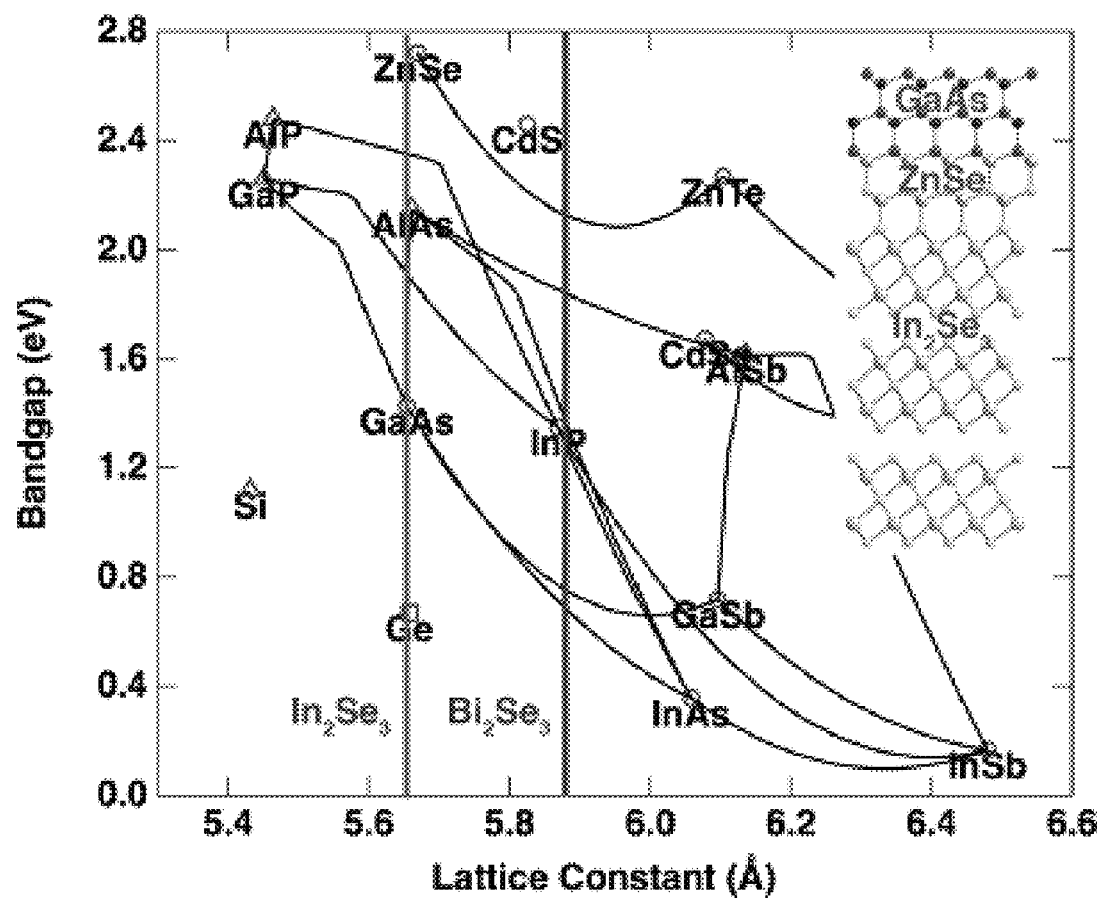
FIG. 15 depicts III-V and II-VI semiconductors that can be lattice matched to the {111} surface of layered $In_2Se_3$ and $Bi_2Se_3$. As depicted in FIG. 15, $Bi_2Se_3$ is nearly lattice-matched to InP and $In_2Se_3$ is nearly lattice matched to GaAs and ZnSe. The inset shows a ZnSe and GaAs heterostructure grown lattice matched on {111} $In_2Se_3$.

Here we show that $Bi_2Se_3$ can be converted to $In_2Se_3$ by annealing under trimethylindium (TMIn). This changes both the bandgap and the lattice constant (FIG. 15). The $Bi_2Se_3$ has a given bandgap and the in-plane lattice constant for the (0001) cleavage surface is in line with other like surfaces. The In conversion process replaces Bi with In, creating $In_2Se_3$ which retains the 2D layered structure of the $Bi_2Se_3$, but with a bandgap of a given eV and a given in-plane lattice constant.

Figure 16:
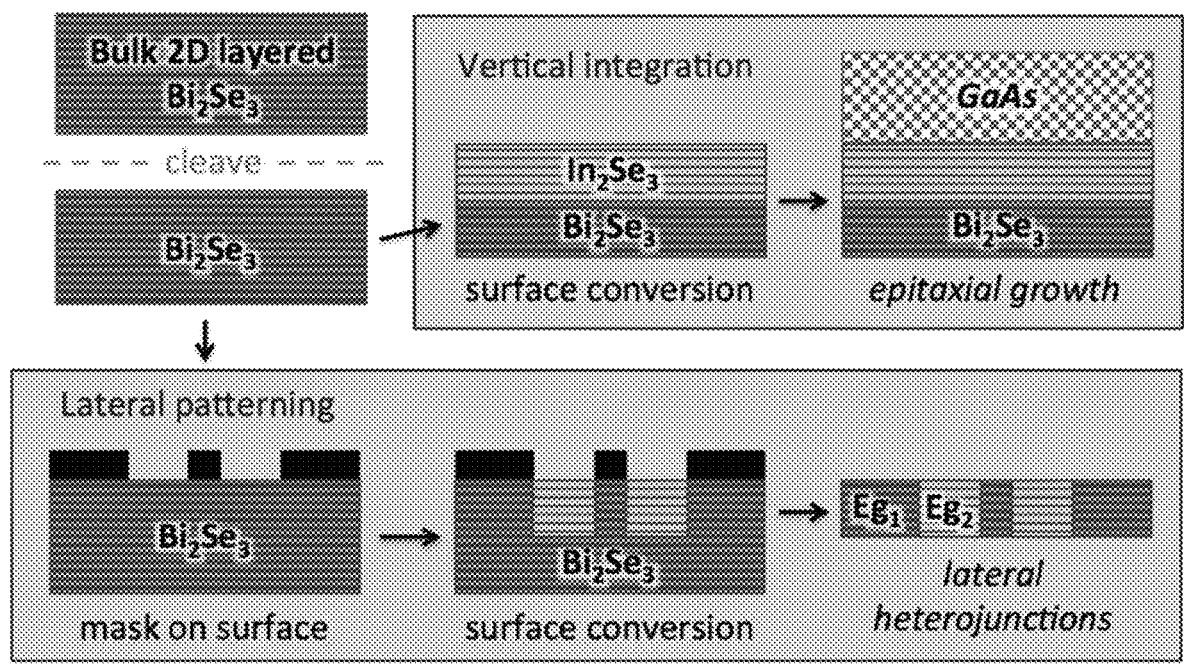
FIG. 16 depicts a process flow for two possible applications. For vertical integration, the conversion to $In_2Se_3$ provides the in-plane surface lattice constant needed for the growth of GaAs(111). However, the 2D $In_2Se_3$(0001) surface lacks dangling bonds, so epitaxial growth will require some additional surface treatment. In the second application, lateral heterojunctions could be created by masking the surface and converting selected regions of the surface.

This conversion could be utilized for a variety of purposes (FIG. 16). Here we demonstrate the conversion of the entire surface from $Bi_2Se_3$ to $In_2Se_3$, but if this is done by converting only selected areas of the surface (by masking, for example), then the bandgap of a 2D layer can be varied laterally, creating lateral heterojunctions within a single-crystal 2D layer. An excellent example of this is the MoS/$MoSe_2$ system. Similar patterning should be possible for the $In_2Se_3$/$Bi_2Se_3$ system.

The change of lattice constant is also of interest for the vertical integration with other materials, because the in-plane lattice constant of $In_2Se_3$(0001) is nearly lattice-matched to GaAs(111), and $Bi_2Se_3$(0001) is nearly lattice-matched to InP(100), as seen in FIG. 15. To be utilized for this purpose, however, the $In_2Se_3$ surface must somehow be modified to provide the dangling bonds needed for GaAs nucleation.

Finally, the materials science associated with the conversion of 2D $Bi_2Se_3$ into 2D $In_2Se_3$ is also quite interesting, in that the lattice constant is altered by gradually changing the stoichiometry of layers attached to each other through very weak van der Waals bonds. Throughout this conversion, the lattice-mismatched interfaces should be extremely glissile, providing a very different environment for dislocation creation and propagation than for traditional lattice-mismatched epitaxy.

We describe the conversion of $Bi_2Se_3$ to $In_2Se_3$ using TMIn in a metalorganic chemical vapor deposition (MOCVD) reactor. However, the exact source of In may not be important, so the potential applications described above could potentially be realized using a variety of growth methods.

For this study, large single-crystal $Bi_2Se_3$ substrates were prepared. After cleaving to expose a $Bi_2Se_3$(0001) surface, (1 cm) 2 samples were attached to a Mo sample holder with Mo clips and loaded into an MOCVD reactor operated at 50 torr with 6 l/min of $H_2$ carrier gas. For conversion to $In_2Se_3$, the samples were heated to 450-550° C. under ~0.2 torr $AsH_3$, then annealed for 2 minutes under TMIn, then cooled to near room temperature under $H_2$ carrier gas.

To characterize the resulting surfaces, samples were transferred under vacuum to an ultra-high vacuum (UHV) chamber for Auger electron spectroscopy (AES) and low-energy electron diffraction (LEED). The crystal structure and quality of both the $In_2Se_3$ layer and underlying $Bi_2Se_3$ were then characterized with x-ray diffraction (XRD), transmission electron microscopy (TEM) and atomic-force microscopy (AFM).

Figure 17:
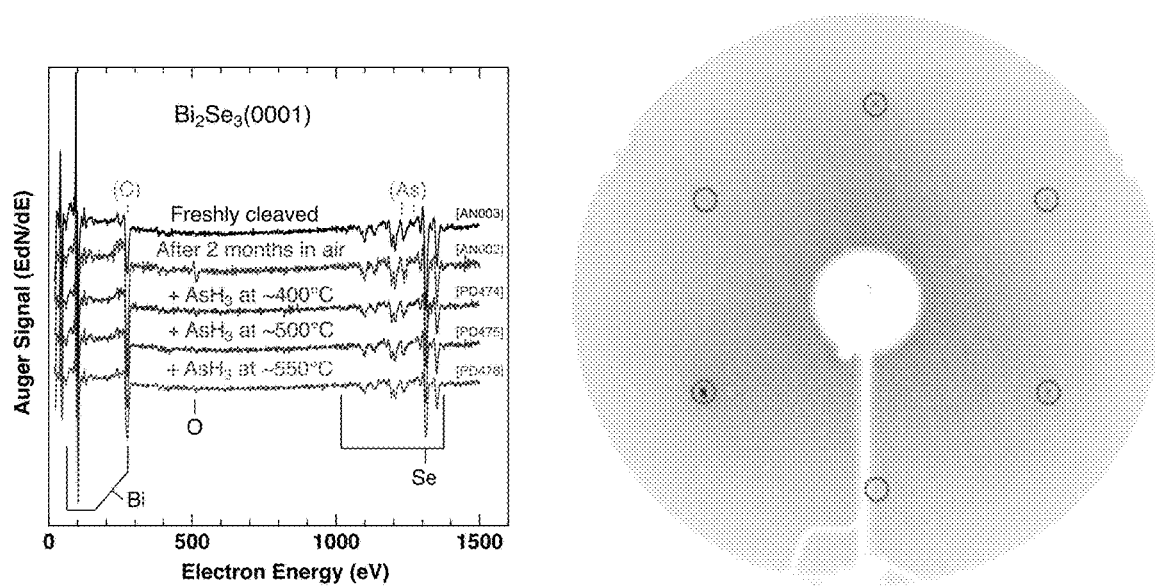
FIG. 17 depicts (Left) Auger electron spectroscopy (AES) shows that the freshly cleaved surface was free of oxygen. In AES, both Bi and C can contribute to a peak near 275 eV. Ultraviolet photoemission spectroscopy (not shown) indicated that the surface was carbon-free, so the AES peak at ~272 eV is attributed to Bi. After 2 months in air, an O peak is detected, but this was subsequently removed by heating the sample under $AsH_3$. (Right) A 50-eV LEED pattern for freshly cleaved $Bi_2Se_3$, showing the expected 3-fold rotational symmetry. The in-plane lattice constant of $Bi_2Se_3$ (0001) seen here nearly matches that of InP(111).

Sample Preparation and UHV Surface Analysis. Prior to TMIn exposure, freshly-cleaved $Bi_2Se_3$ surfaces were examined with LEED and AES, and found to be clean and well-ordered (FIG. 17). Because there is interference between a C peak at 275 eV and a Bi peak at 272 eV, a cleaved sample was also examined with ultraviolet photoemission spectroscopy (UPS), and no C was detected. The lack of carbon and oxygen is consistent with the lack of dangling bonds for an ideal cleave between van der Waals bonded layers. The excellent crystallinity and quality of the cleaved surface is also evident in the LEED pattern, which has sharp diffraction spots with the expected 3-fold rotational symmetry. This is consistent with the extremely low step density for similarly prepared samples imaged with atomic-force microscopy.

To address the impact of atmospheric contamination on cleaved $Bi_2Se_3$ surfaces, FIG. 17 also includes samples which were exposed to air for 2 months after cleavage, and then briefly annealed under $AsH_3$ (carried by $H_2$). This was done with a 3 minute ramp to the annealing temperature, followed by 30 seconds at the annealing temperature, then a rapid (1 to 2 minute) cooldown to near room temperature, all under ~0.2 torr $AsH_3$.

The results in FIG. 17 show that even when prolonged atmospheric exposure contaminated the surface, a brief $AsH_3$ anneal was able to clean the surfaces again. $AsH_3$ was used because prior work has shown that atomic H released by $AsH_3$-cracking can effectively remove C and 0 during the preparation of As/Ge and As/Si surfaces. It is, however, possible that $Bi_2Se_3$ surfaces are more inert and can be cleaned by an anneal under just $H_2$, without the $AsH_3$. In this work, no As incorporation into the $Bi_2Se_3$ was detected in the AES scans, so all samples were heated under $AsH_3$ to keep the surfaces as clean as possible.

Figure 18:
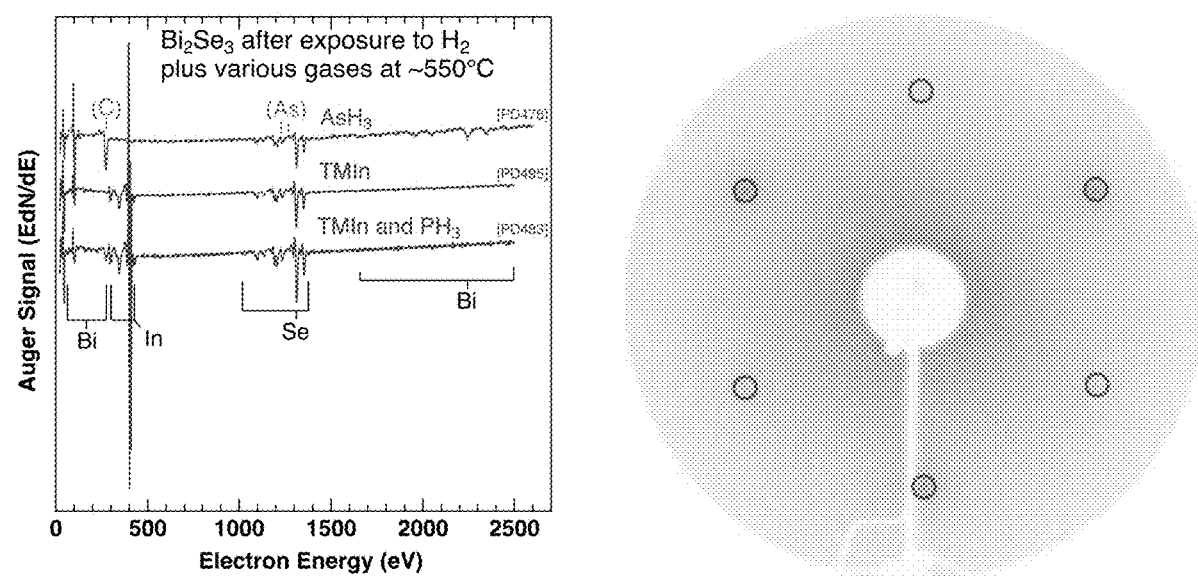
FIG. 18 depicts (Left) AES scans after annealing a $Bi_2Se_3$ sample under various MOCVD precursors. After annealing under $AsH_3$, only Bi and Se peaks are visible. After annealing under TMIn, the Bi peaks have been replaced by In peaks, consistent with the formation of an $In_xSe_y$ compound subsequently identified as $In_2Se_3$. The lack of a P peak for the anneal under TMIn and $PH_3$ indicates that InP epilayer growth occurred. (Right) A 50 eV LEED image for the anneal under TMIn and $PH_3$ shows that the $In_2Se_3$ has retained the crystal symmetry of the $Bi_2Se_3$, but with ~4% smaller lattice constant. The in-plane lattice constant of $In_2Se_3$(0001) seen here nearly matches that of GaAs(111).

The conversion to $In_2Se_3$ is examined in FIG. 18. The topmost AES scan in FIG. 18 serves as a clean-surface benchmark, with very clear Bi peaks between 1700 and 2500 eV. To prepare the other two samples in FIG. 18, the samples were heated to 550° C. as described above, then annealed at 550° C. for an additional 7.66 min under either TMIn alone, or a mixture of TMIn and $PH_3$ (intended to produce InP growth), then cooled to room temperature. For the sample exposed to $PH_3$, $PH_3$ flow was maintained at 1.7 torr during the anneal, and 0.4 torr during the cooldown. For the sample exposed only to TMIn, cooldown was performed under $H_2$ only.

In both cases, the AES scans in FIG. 18 indicate that exposure to TMIn converted the surface layers of the $Bi_2Se_3$ to an InSe compound, subsequently identified as $In_2Se_3$. The LEED images show that the $In_2Se_3$ surfaces retain the 3-fold symmetry and orientation of the underlying $Bi_2Se_3$, but with a slight (~4%) reduction in in-plane lattice constant. As mentioned earlier, this lattice constant is of interest for GaAs growth, because it matches the in-plane lattice constant for GaAs(111).

Retention of the 3-fold symmetry of the substrate indicates that the crystalline structure of the $Bi_2Se_3$ is preserved during the conversion process, creating a single crystal layer of $In_2Se_3$. As mentioned earlier, the strain relaxation processes for gradually changing the lattice constant of a 2D material (here) are different from those associated with the (additive) epitaxial growth of lattice-mismatched epilayers. If each 2D layer remains contiguous throughout the $Bi_2Se_3$ to $In_2Se_3$ lattice constant change, then it would be possible to avoid the high densities of "geometrically necessary" threading dislocations (typically $10^8$ cm$^{-2}$ or more) associated with similarly lattice-mismatched interfaces produced via traditional epitaxy.

TEM and EDS Analysis. The scanning transmission electron microscopy (STEM) image in FIG. 19 and associated energy-dispersive x-ray spectroscopy (EDS) scans provide some insight into how the conversion to $In_2Se_3$ occurs. The uppermost layers are $In_2Se_3$, the bottommost layers are $Bi_2Se_3$, and the intervening material is Bi-rich $Bi_xSe_y$. The Bi-rich layer, combined with the fact that no Se was externally provided leads to the conclusion that the In atoms from TMIn flux displaced Bi atoms in the $Bi_2Se_3$ to create $In_2Se_3$, and the excess Bi migrated downwards into the underlying $Bi_2Se_3$ to make it Bi-rich. In other words, the $In_2Se_3$ was created topotaxially from the $Bi_2Se_3$.

The thickness of the $In_2Se_3$ is also of interest. The TMIn flow rate was such that it would have produced 0.25 μm if the same flow rate were used for InP growth on an InP substrate. Therefore, nearly all of the In incident upon the surface converted $Bi_2Se_3$ to $In_2Se_3$. This suggests that there is a very strong driving force for the conversion to $In_2Se_3$, which may in turn indicate that the exact source of In may not be important, and that the $Bi_2Se_3$-to-$In_2Se_3$ conversion process may be transferable to a variety of different growth techniques using different group-III sources. It also suggests that there must be some very effective mechanism for transporting In atoms from the $In_2Se_3$ top surface to the underlying $In_2Se_3/Bi_xSe_y$ interface.

Figure 19:
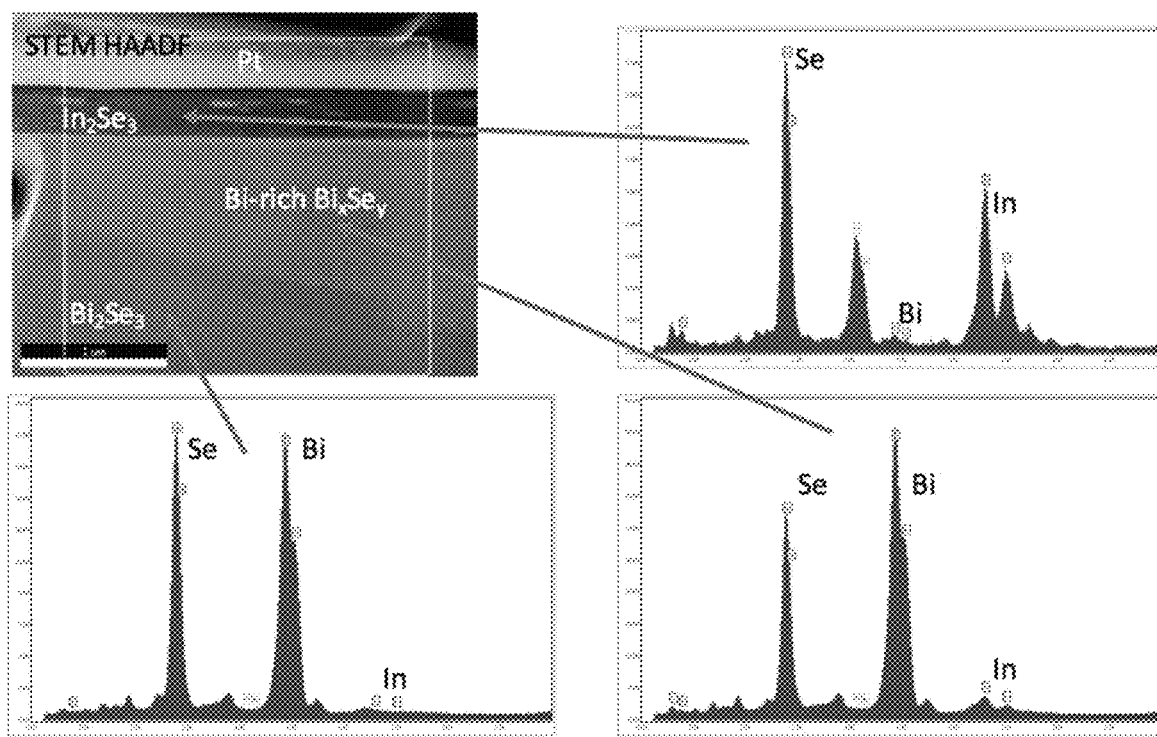
FIG. 19 depicts a scanning transmission electron microscopy (STEM) high angle annular dark field (HAADF) image of the converted $In_2Se_3$ layer, underlying $Bi_2Se_3$ substrate, and intervening Bi-rich $Bi_xSe_y$ layer, along with energy dispersive x-ray spectroscopy (EDS) spectra depicting the elemental composition of each layer. The $Bi_2Se_3$ material near the interface has been labeled $Bi_xSe_y$ because it has become Bi-rich and somewhat disordered. The most likely source of this excess Bi is downward diffusion of Bi displaced during the $In_2Se_3$ conversion.

FIG. 19 also contains some interesting features which could provide some insight into exactly how the conversion process occurs. For example, the interface between the Bi-rich layer and the underlying $Bi_2Se_3$ is not planar, so the Bi migration is not likely just a simple, uniform downwards diffusion. In contrast, the bottom interface of the $In_2Se_3$ layer is very planar, suggesting that once the In-conversion process of each individual 2D layer begins, the conversion process travels rapidly laterally, converting each layer sequentially before beginning the conversion of underlying layers.

Figure 20:
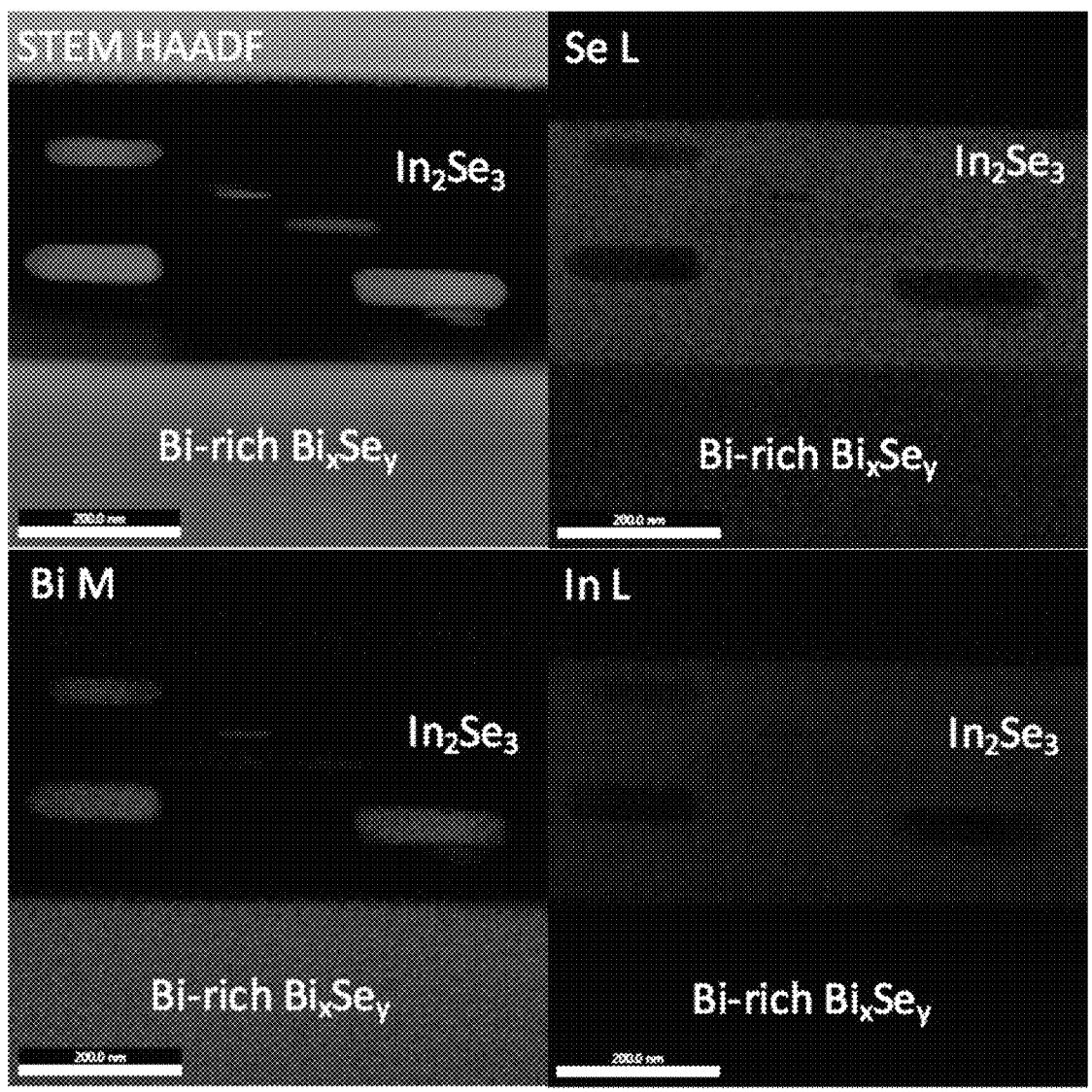
FIG. 20 depicts STEM EDS atomic percent maps corresponding to the STEM HAADF image in the upper left. The results are consistent with surface conversion to $In_2Se_3$, and diffusion of the displaced Bi into the underlying $Bi_2Se_3$ to become a more Bi-rich $Bi_xSe_y$ alloy. Some unconverted Bi-rich "islands" can be found in the $In_2Se_3$ layer.

The EDS atomic-percent maps in FIG. 20 clearly illustrates the abruptness of the $In_2Se_3/Bi_xSe_y$ interfaces created by the conversion process. Not only is the bottom surface of the $In_2Se_3$ layer abrupt, but the interfaces between the $In_2Se_3$ and the remaining $Bi_xSe_y$ inclusions are also abrupt. In other words, there is a very strong tendency for the Bi displaced by the In conversion process to leave the $In_2Se_3$ and migrate into adjacent $Bi_xSe_y$. (At this point the origin of the $Bi_xSe_y$ inclusions is unknown. Once their origin is known, it may be possible to produce $In_2Se_3$ without them.)

Figure 21:
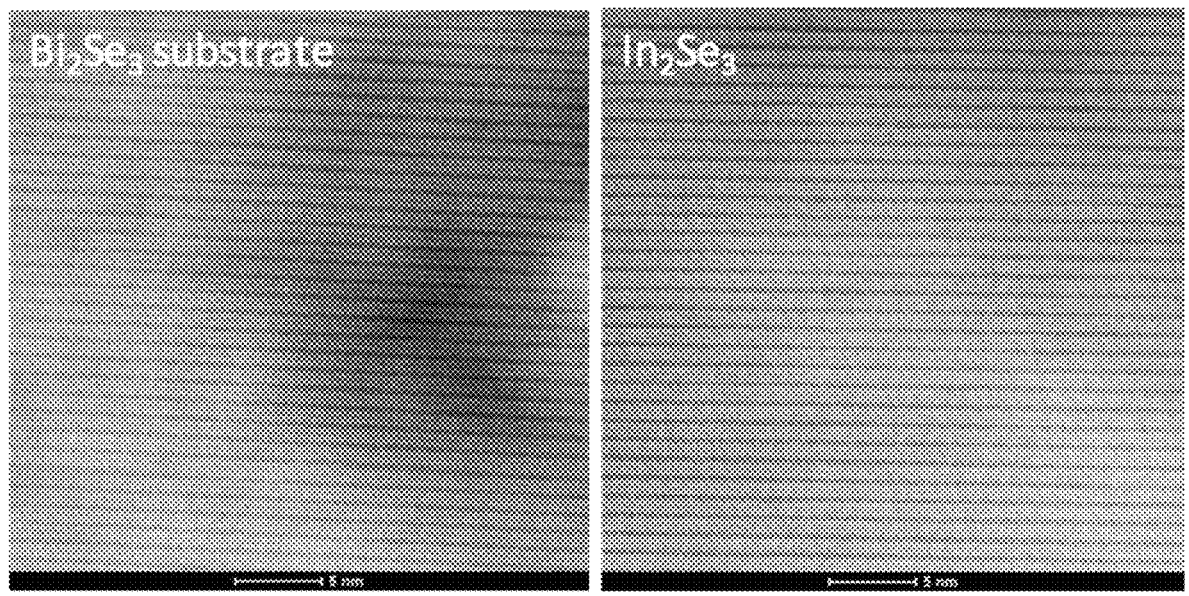
FIG. 21 depicts STEM HAADF images showing the atomic structures of (left) $Bi_2Se_3$ substrate and (right) converted $In_2Se_3$ layer.
Figure 22:
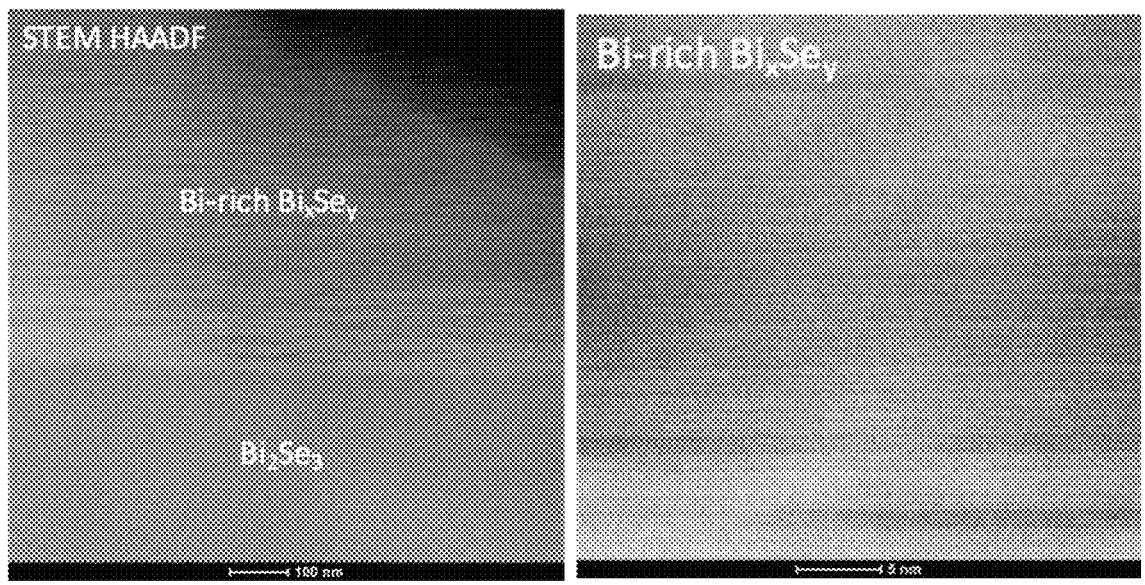
FIG. 22 depicts low magnification STEM HAADF image of (left) a Bi-rich region and adjacent unconverted $Bi_2Se_3$ substrate, and (right) a high-resolution STEM HAADF image of the atomic structure in the Bi-rich region.

FIG. 21 shows the excellent crystallinity of both the $Bi_2Se_3$ and $In_2Se_3$. Similar crystal quality has yet to be obtained for the bulk growth of 2D $In_2Se_3$. The perfection of the $In_2Se_3$ is also striking because it forms from the flawed-looking Bi-rich layer beneath it (FIG. 22). The perfection of the $In_2Se_3$ may be because the $In_2Se_3$ is very stable energetically, or the underlying Bi-rich $Bi_xSe_y$ may continue to provide a perfect starting template for topotaxial conversion if it is $Bi_2Se_3$ intercalated with loosely-bound Bi (in which case the $Bi_2Se_3$ layers provide the topotaxial template, and the loosely bound Bi atoms simply continue to move downwards into the underlying $Bi_xSe_y$).

Figure 25:
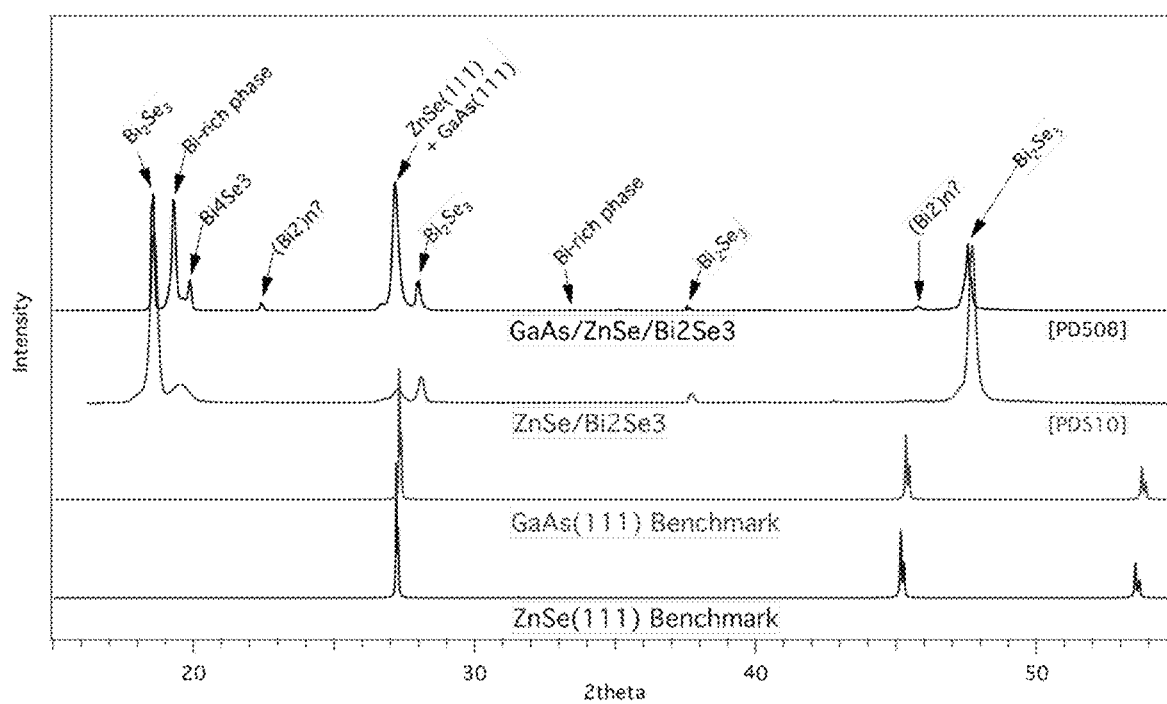
FIG. 25 depicts x-ray diffraction (XRD) showing evidence of conversion of $Bi_2Se_3$ to ZnSe and the subsequent growth of GaAs on top. XRD peaks for ZnSe, GaAs and $Bi_xSe_y$ can all be identified.

In an embodiment, FIG. 25 depicts low-resolution XRD illustrating conversion of a $Bi_2Se_3$ surface to {111} textured cubic ZnSe achieved by exposure of a heated, cleaved $Bi_2Se_3$ template to a flux of diethylzinc thus forming the surface with the dangling bonds required for nucleation and growth of GaAs on top of 2D layered materials such as $Bi_2Se_3$. FIG. 25 also depicts {111} textured GaAs growth on top of a ZnSe converted $Bi_2Se_3$ surface as evidenced by the presence of XRD peaks for ZnSe, GaAs and $Bi_xSe_y$ which can all be identified. As depicted in FIG. 15, ZnSe is lattice-matched to GaAs and has the same cubic zincblende crystal structure and so this ZnSe conversion process provides a method for the formation of a lattice matched, cubic ZnSe buffer layer formed on 2D layered materials such as $Bi_2Se_3$ and $In_2Se_3$ for the growth of GaAs on top.

Figure 23:
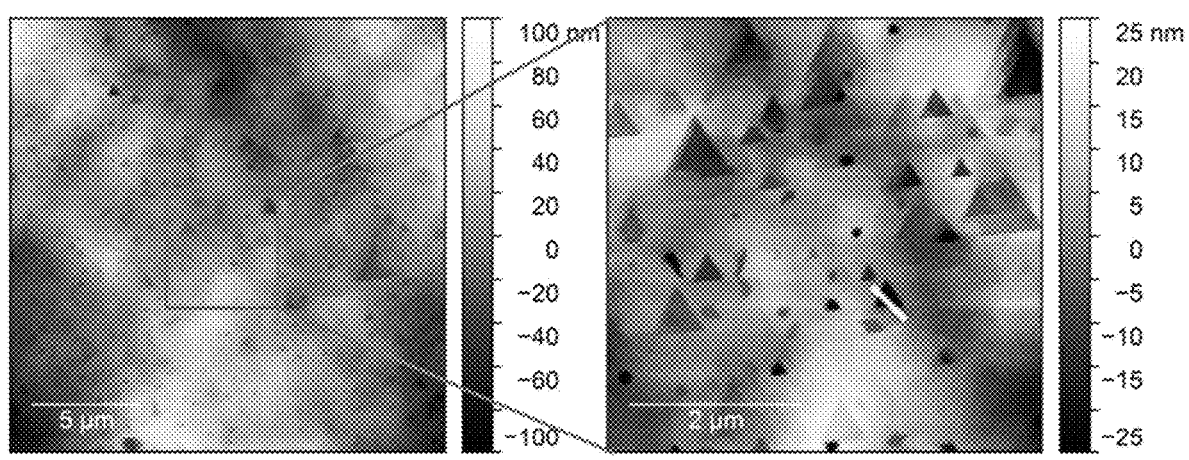
FIG. 23 depicts that the AFM of the original $Bi_2Se_3$ surface is essentially flawless, but the In conversion process creates triangular-shaped pits in the $In_2Se_3$ surface.
Figure 24:
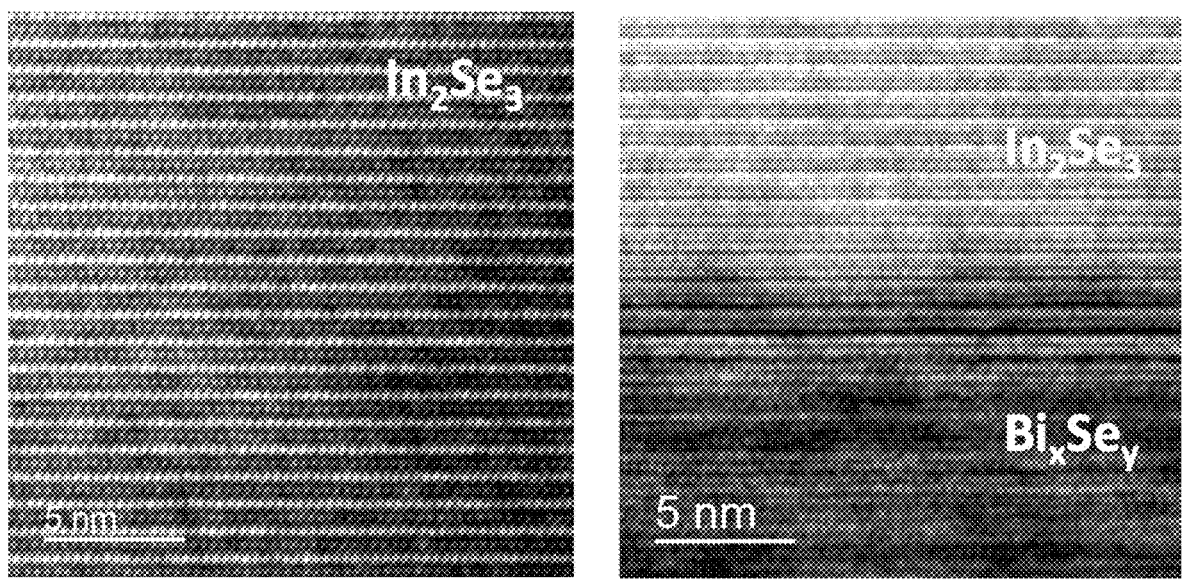
FIG. 24 depicts cross-sectional high resolution transmission electron microscopy (TEM) images of (left) $In_2Se_3$ and (right) the interface between the converted $In_2Se_3$ layer and a disordered $Bi_xSe_y$ layer.

Ex situ Surface Analysis. The atomic-force microscopy (AFM) images in FIG. 23 show that the original $Bi_2Se_3$ surface in essentially flawless, but the In conversion process creates triangular-shaped pits in the $In_2Se_3$ surface. The origin of these pits is unknown, but it is possible that pitting could be reduced by changing the In conversion process conditions, or by converting a much thinner layer.

It is also possible that these pits provide an efficient migration route for In at the surface to travel through the $In_2Se_3$ layer to reach the $In_2Se_3/Bi_xSe_y$ interface.

In an attempt to grow InP on $Bi_2Se_3$, most of the surface converted to $In_2Se_3$, but a few points on the surface served as nucleation sites for InP nanowires. The lack of InP growth over the remainder of the surface is related to the lack of dangling bonds on the (0001) surface of layered-2D materials. Therefore, uniform nucleation and growth of a III-V material on these surfaces will require some sort of surface modification or conversion to create a surface with dangling bonds.

Growth of GaAs on Single-Crystal Layered-2D $Bi_2Se_3$

Compelling properties have been demonstrated in a wide variety of 2D and layered materials; however, traditional semiconductor devices are based on 3D, epitaxial materials. Integration of 2D with 3D semiconductors would enable new classes of hybrid materials and devices that combine the beneficial properties of both material classes, enabling new applications. One specific application where integration of 2D and 3D materials is compelling is utilization of van der Waals bonded materials as "release" layers to enable epitaxial lift off of semiconductor devices. This application is of particular value in the case of III-V solar cells. Despite the record one-sun efficiencies of single-junction GaAs solar cells, they comprise just a small fraction of the solar market. A principal reason for this is the expense of high-quality single-crystal substrates such as GaAs or Ge, which could be mitigated by substrate reuse.

In an embodiment, a solution to this challenge leverages the unique properties of 2D layered materials, mainly the weak van der Waals bonds between layers. If a van der Waals bonded crystal is used as an epitaxial substrate for GaAs, the resulting film can be exfoliated between the substrate layers, leaving a substrate ready for reuse without any costly cleaning steps or kerf losses. Additionally, growth on layered surfaces (known as van der Waals epitaxy)

enables strain-free material due to the lack of dangling bonds. However, epitaxial growth of 3D materials on 2D layers is challenging due to suppressed nucleation from the van der Waals terminated surface. Though GaAs has been grown on 2D monolayers by remote epitaxy, synthesis of GaAs on bulk 2D materials remains relatively unexplored.

Figures 26A, 26B:
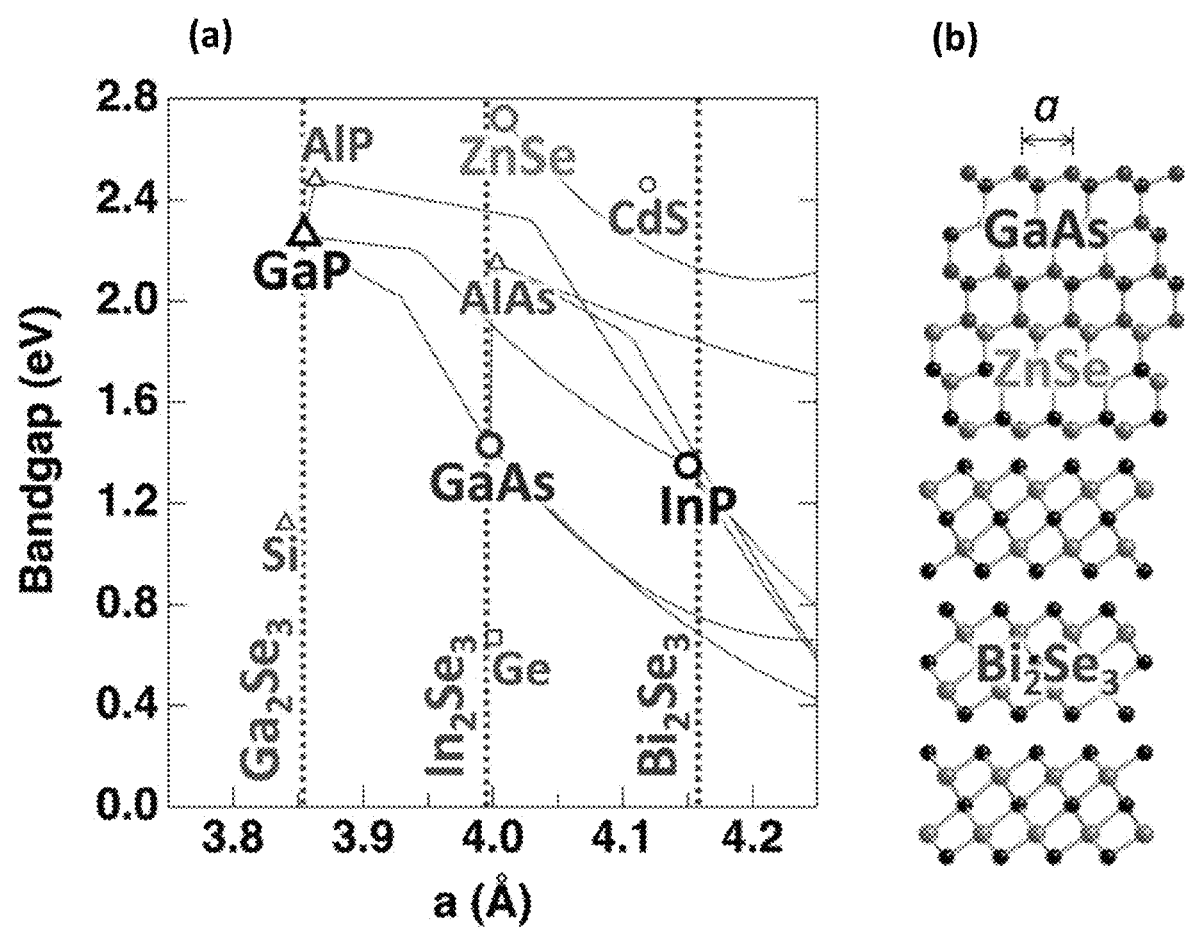
FIG. 26a depicts bandgap versus in-plane lattice constant "a" for common semiconductors, where "a" is defined to be the (111) or (0001) primitive surface lattice constant. (For cubic materials $a=a_0/2$.) Because (0001) and (111) surfaces share the same 3-fold symmetry, materials can be in-plane lattice-matched across a (111)/(0001) interface if their in-plane "a" lattice constants are the same. The line drawn for $In_2Se_3$ corresponds to the 0 layered 2D phase that has the same R-3 m space group as layered $Bi_2Se_3$. The $Ga_2Se_3$ obtained herein is consistent with a cubic phase containing disordered Ga vacancies.
FIG. 26b depicts side views showing GaAs (111) and ZnSe (111) on top of layered-2D $Bi_2Se_3$ (0001), with "a" shown for GaAs.

$Bi_2Se_3$ (0001) has a phase diagram that allows for the single-phase growth of bulk crystals and is in-plane lattice-matched to InP (111) (see FIGS. 26a, 26b). We have previously reported that cm-sized single-crystal substrates can be grown using the Bridgman method and cleaved to expose nearly atomically-flat surfaces with a step spacing of about 70 µm. However, our initial attempts at InP growth using trimethylindium and phosphine did not produce an InP epilayer.

Instead, the In converted the surface layers of $Bi_2Se_3$ into layered-2D β-$In_2Se_3$ (0001). Thus, without being limited by theory, β-$In_2Se_3$ (0001) is in-plane lattice matched to GaAs (111), but it also demonstrates how MOCVD precursors can readily interact with the substrate, preventing the intended epitaxial III-V growth.

In an embodiment, $Bi_2Se_3$ (0001) is heated under DEZn to convert the surface to ZnSe (111), then the resulting ZnSe is used as a lattice-matched template for the growth of GaAs (111). The resulting GaAs epilayer was readily exfoliated from the underlying $Bi_2Se_3$ substrate using two glass slides and double-sided adhesive tape.

In an embodiment, a barrier between the GaAs and $Bi_2Se_3$ was created wherein the $Bi_2Se_3$ substrate was annealed under triethylgallium (with no ZnSe barrier) and the surface layers converted to cubic $Ga_2Se_3$ (111) which was lattice-matched to Si and GaP (see, FIGS. 26a, 26b).

Experimental Methods

Single-crystal layered-2D $Bi_2Se_3$ was grown by the Bridgman method and cleaved to create $(1 \text{ cm})^2$ $Bi_2Se_3$ (0001) substrates. For growth experiments, these substrates were attached to a Mo sample holder with Mo clips, then loaded into a low-pressure metalorganic chemical-vapor deposition (MOCVD) reactor operated at 50 Torr with 6 l/min of $H_2$ carrier gas.

Before use, all $Bi_2Se_3$ substrates were heated to 550° C. under about 0.2 Torr $AsH_3$ to remove surface contamination. The effectiveness of this "$AsH_3$-cleaning" procedure was assessed by transferring samples under vacuum from the MOCVD chamber to a surface analysis chamber equipped with Auger electron spectroscopy (AES) and low-energy electron diffraction (LEED). In an embodiment, heating under $H_2$ only (without $AsH_3$) may be adequate for $Bi_2Se_3$.

ZnSe was formed by annealing $Bi_2Se_3$ (0001) under diethylzinc (DEZn), and GaAs was grown using triethylgallium (TEGa) and arsine ($AsH_3$). Before removal from the MOCVD reactor, samples were cooled to near room temperature under $H_2$ carrier gas. In addition to the aforementioned AES and LEED, the structure and composition of these layers were determined by transmission electron microscopy (TEM), transmission electron diffraction (TED) and scanning transmission electron microscopy (STEM) in combination with elemental analysis using energy dispersive x-ray spectroscopy (EDS).

$Bi_2Se_3$ (0001) Surface

After $AsH_3$-cleaning, all $Bi_2Se_3$ (0001) surfaces were clean (see FIG. 27, bottom trace), with a 3-fold rotationally symmetric LEED pattern. Some surface pitting was observed in atomic force microscopy (AFM) images.

ZnSe Buffer Layer

To create a ZnSe buffer layer, $Bi_2Se_3$ (0001) samples were annealed under diethylzinc (DEZn) while the sample temperature was lowered from 400 to 300° C. over 20 min. The DEZn flow rate was set to a level typically used for heavily doping III-V materials; based upon the resulting ZnSe thickness, a large fraction of the incoming DEZn flux was incorporated into the resulting ZnSe. Only Zn and Se peaks were observed in AES (see second trace from the bottom in FIG. 27), consistent with the formation of a ZnSe compound.

Low resolution x-ray diffraction (XRD) from this sample (see FIG. 28, middle trace for sample PD508) contains a ZnSe (111) peak, consistent with the formation of (111)-textured ZnSe. Therefore, ZnSe is lattice-matched to GaAs, and provides an appropriate surface for GaAs nucleation and growth.

Figures 29A, 29B:
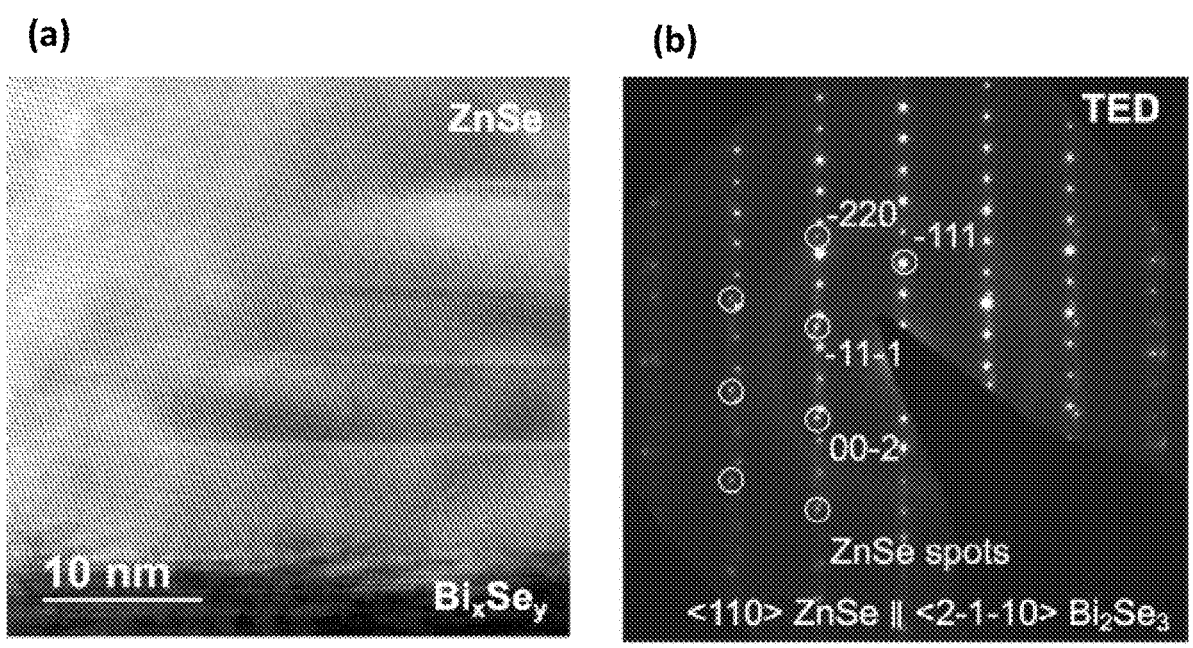
FIGS. 29a and 29b depict high-resolution TEM (FIG. 29a) and selected-area transmission electron diffraction (FIG. 29b) for a $Bi_2Se_3$ (0001) substrate annealed under DEZn to create a surface ZnSe layer. In this area ZnSe is epitaxial with respect to the $Bi_2Se_3$ substrate with an epitaxial relationship of {111} ZnSe∥ (0001) $Bi_2Se_3$ and ⟨110⟩ ZnSe∥<2-1-10>$Bi_2Se_3$. [Sample PD508].
Figure 30:
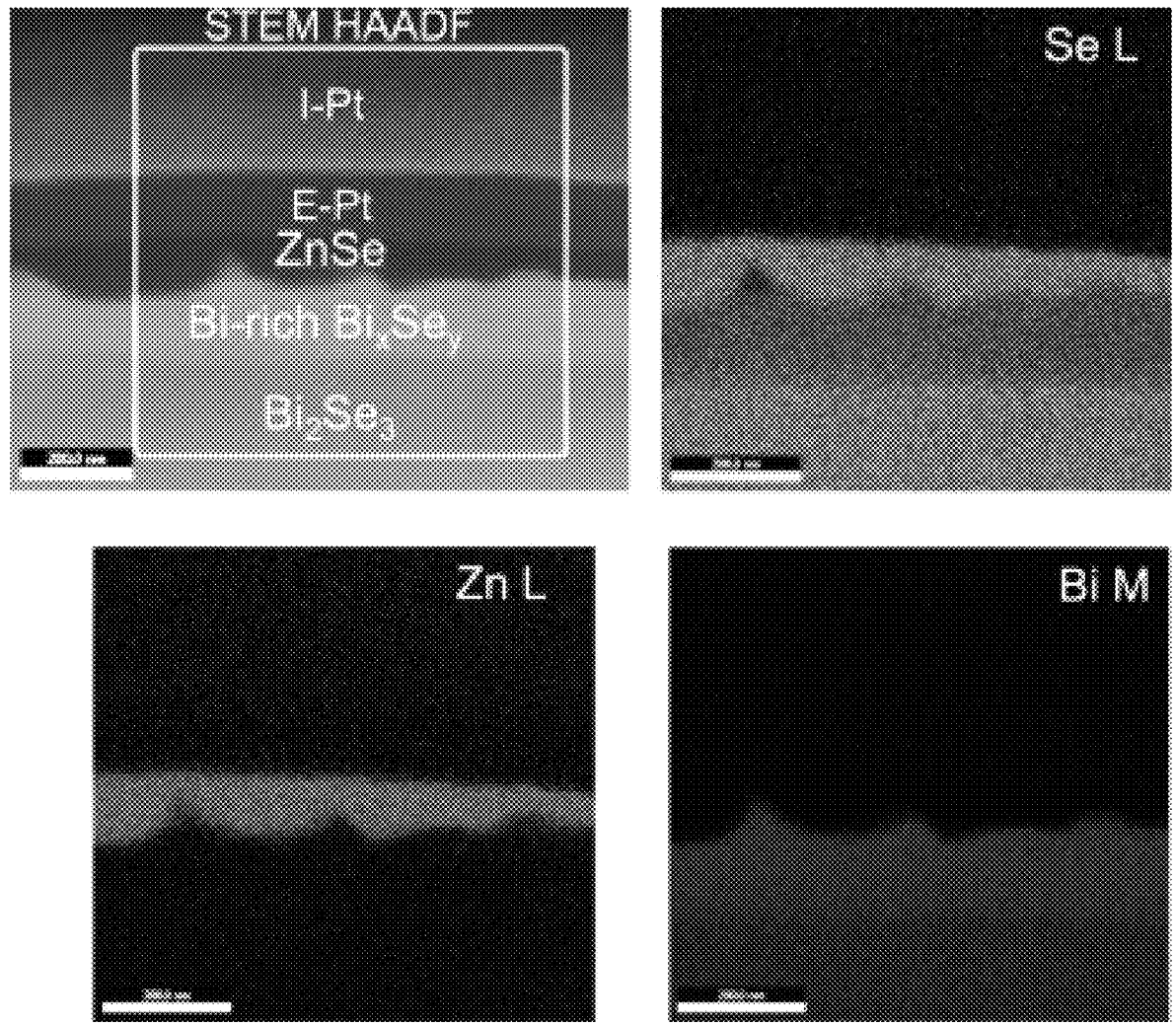
FIG. 30 depicts scanning transmission-electron-microscopy (STEM) and corresponding energy-dispersive x-ray spectroscopy (EDS) elemental maps for a $Bi_2Se_3$ (0001) substrate annealed under DEZn to create a surface ZnSe layer. [Sample PD508] Scale bars=200 nm.

High resolution TEM and selected area transmission electron diffraction (see FIGS. 29a and 29b) confirmed the presence of regions of ZnSe epitaxially aligned to the underlying $Bi_2Se_3$ substrate, with the epitaxial relationship {111} ZnSe//(0001) $Bi_2Se_3$ and (110) ZnSe/1<2-1-10>$Bi_2Se_3$. Diffraction contrast TEM suggested that the initial ZnSe layers were polycrystalline despite being (111) textured. STEM high angle annular dark field (HAADF) imaging and EDS elemental maps show the formation of a distinct ZnSe layer at the $Bi_2Se_3$ surface (see, FIG. 30).

Formation of $Bi_xSe_y$

Figure 28:
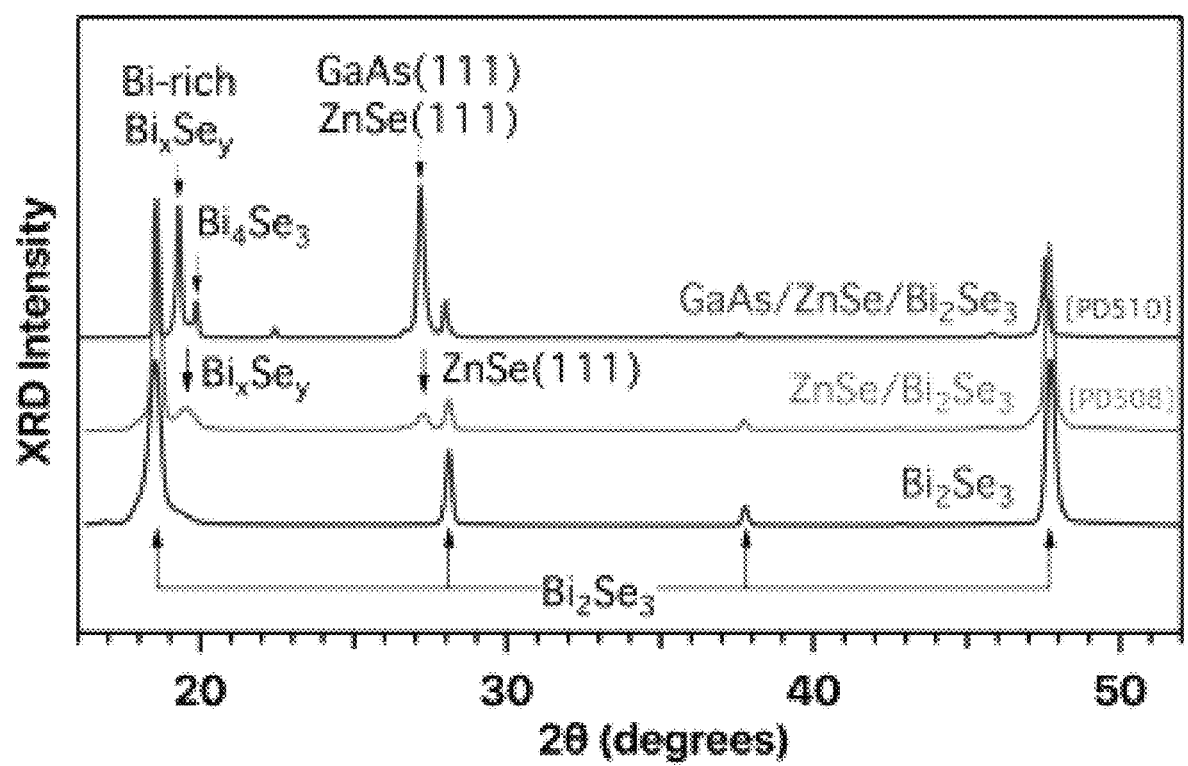
FIG. 28 depicts X-ray diffraction (XRD) ω-2θ scans for: (bottom) a $Bi_2Se_3$ (0001) substrate, (middle) $Bi_2Se_3$ (0001) annealed under DEZn, which converts surface layers to ZnSe (111) and (top) a different $Bi_2Se_3$ sample with the same ZnSe-creation conditions followed by GaAs (111) growth. [Samples PD508 and PD510].

Without being limited by theory, because no external Se was supplied, the formation of ZnSe should create excess Bi somewhere. STEM EDS shows that this occurs beneath the ZnSe via the formation of a Bi-rich $Bi_xSe_y$ layer (see FIG. 30). Structurally, layered-2D $Bi_xSe_y$ can be formed by inserting $Bi_2$ sheets into the van der Waals gaps of $Bi_2Se_3$. By varying the relative number and arrangement of $Bi_2$ sheets and $Bi_2Se_3$ layers a wide variety of "polytypes" with different unit cell heights and stoichiometries can be created and linked to XRD peaks. Peaks corresponding to Bi-rich $Bi_xSe_y$ phases are indicated in FIG. 28.

The $Bi_xSe_y$ is due to the formation of ZnSe. Without being limited by theory, the Zn could be displacing Bi to create ZnSe, and the excess Bi is migrating downwards to create Bi-rich $Bi_xSe_y$. In another embodiment, the $Bi_2Se_3$ could be releasing Se to become Bi-rich and the excess Se travels upwards to combine with the incoming Zn, at the ZnSe surface, or at the ZnSe/$Bi_xSe_y$ interface.

Without being limited by theory, additional reactions are possible such as pinholes in the ZnSe and pits in the $Bi_2Se_3$ substrate that could facilitate vertical migration, and the van der Waals gaps could facilitate lateral migration.

GaAs Growth

Figure 27:
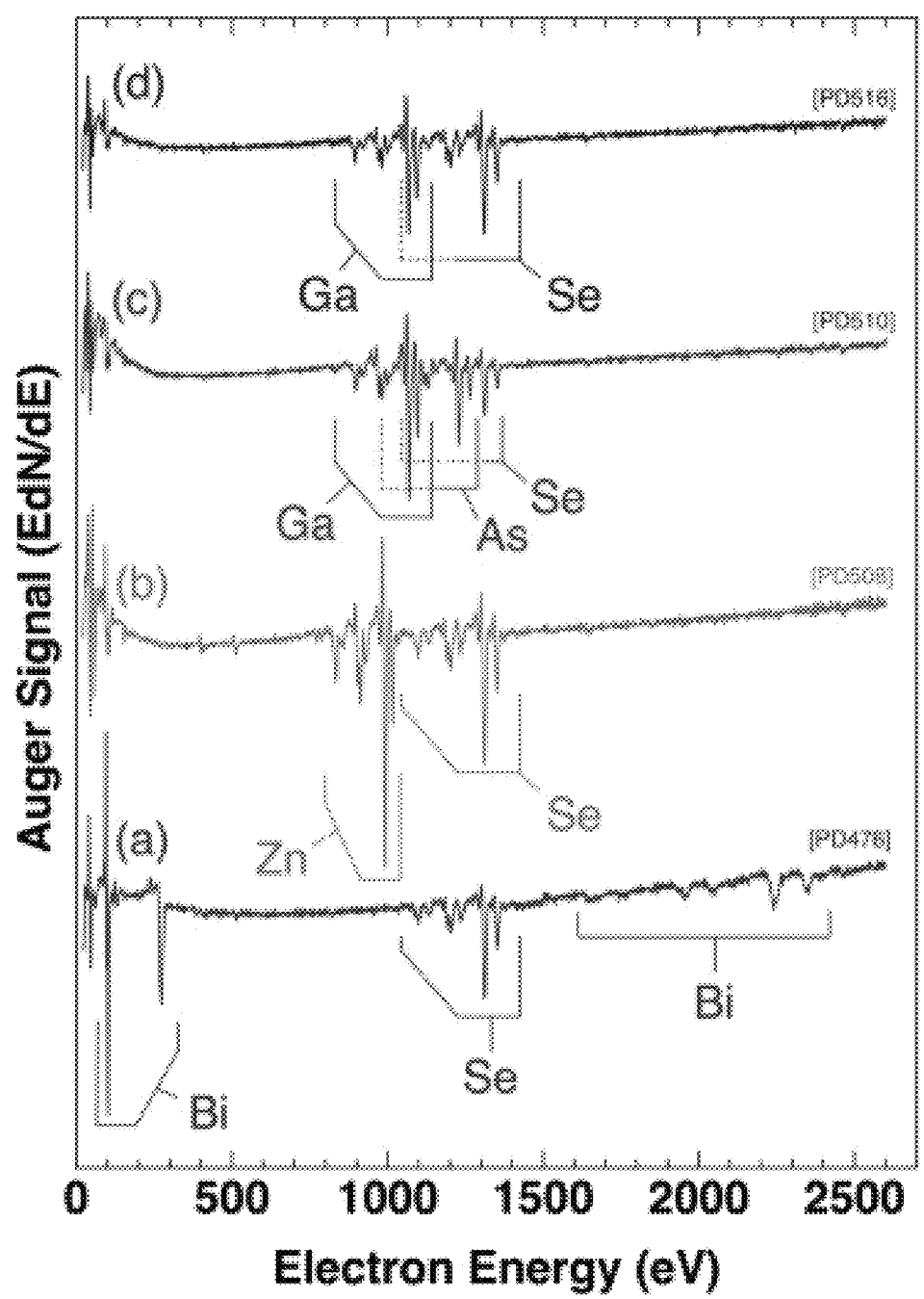
FIG. 27 depicts Auger electron spectroscopy (AES) scans for: (a) single-crystal layered-2D $Bi_2Se_3$ (0001), (b) ZnSe created by annealing $Bi_2Se_3$ (0001) under DEZn, (c) GaAs growth on ZnSe/$Bi_2Se_3$ (0001) and (d) $Ga_2Se_3$ created by annealing $Bi_2Se_3$ (0001) under TEGa. [Samples PD476, 508, 510 and 516].

The third trace from the bottom in FIG. 27 shows an AES spectrum obtained from a 0.25 µm thick GaAs layer grown (at 500° C.) on top of a ZnSe-converted $Bi_2Se_3$ substrate. Peaks originating from Ga, As and Se were observed, but not peaks from Zn or Bi. This is consistent with the growth of a GaAs layer with some Se on the surface and/or in the bulk. Any pinholes in the GaAs layer would also expose underlying Se-rich layers, which would also contribute to the Se AES peak.

XRD from this sample (see FIG. 28, top trace; sample PD510) reveals the presence of a strong peak at the position expected for GaAs (111). Even though GaAs and ZnSe are nearly lattice-matched and we were unable to separately resolve peaks for GaAs and ZnSe (111), this (111) peak is much larger after the GaAs growth, consistent with the growth of (111)-textured GaAs. Peaks associated with the formation of Bi-rich $Bi_xSe_y$ phases were again present, but no other GaAs or ZnSe XRD peaks were observed.

Figures 31A, 31B, 31C:
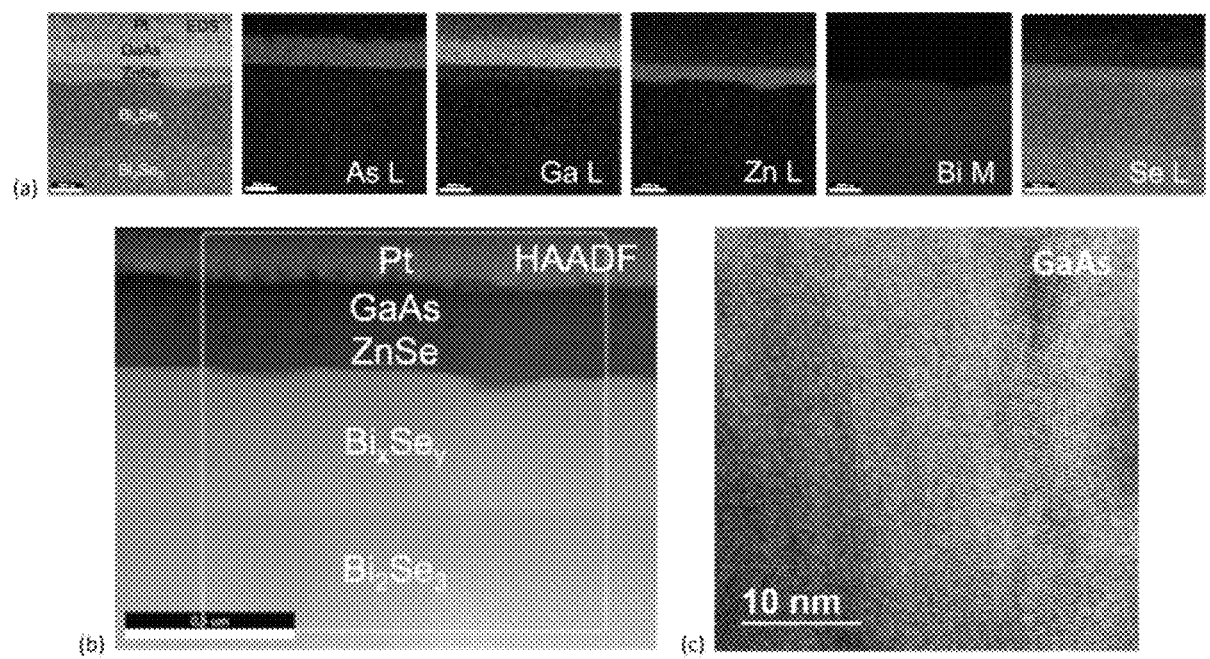
FIG. 31a depicts EDS elemental maps after GaAs growth on a ZnSe/$Bi_2Se_3$ (0001) sample created by annealing a $Bi_2Se_3$ (0001) surface under DEZn. Scale bars=200 nm.
FIG. 31b depicts a corresponding STEM HAADF image. Scale bar=500 nm.
FIG. 31c depicts an XTEM image of a polycrystalline region of the GaAs. [Sample PD510].

Cross-sectional STEM imaging and EDS elemental mapping indicate that a GaAs layer has grown on top of the ZnSe layer (see FIG. 31a, 31b). In an embodiment, the GaAs layer also contains some polycrystalline grains (see FIG. 31c).

Formation of Cubic $Ga_2Se_3$

Without being limited by theory, because ZnSe and GaAs are both cubic zincblende crystals with nearly the same lattice constant, the ZnSe buffer layer may seem superfluous. However, at least for the growth conditions disclosed herein, the ZnSe buffer layer acts as an interaction barrier which prevents reactions between the incoming Ga and the $Bi_2Se_3$ substrate. In an embodiment, the ZnSe buffer layer first thinned, then eliminated.

A first attempt at growing GaAs using a much shorter Zn exposure (to thin the ZnSe layer) did not produce the desired GaAs layer. Instead, the results suggested that a strong interaction between TEGa and exposed $Bi_2Se_3$ was creating a GaSe compound.

Figure 32:
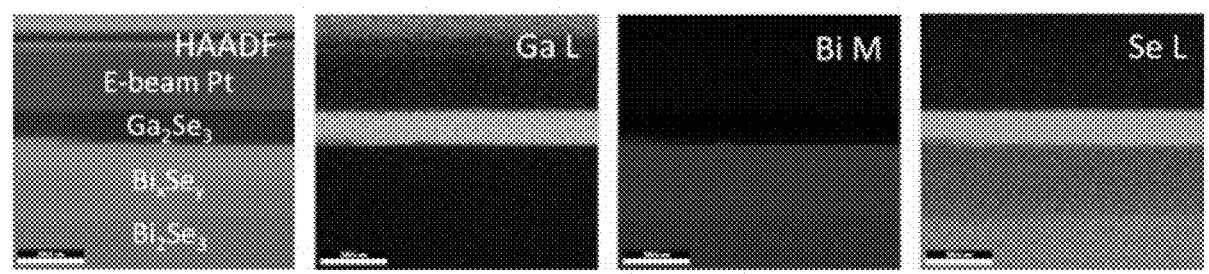
FIG. 32 depicts STEM and corresponding EDS elemental maps for a $Bi_2Se_3$ (0001) substrate annealed under TEGa to create a surface layer of cubic $Ga_2Se_3$. [Sample PD516] Scale bars=200 nm.

In an embodiment, a $Bi_2Se_3$ sample was annealed at 500° C. under a TEGa flux, with no Zn exposure (and therefore no ZnSe). AES for the resulting surface contained Ga and Se peaks (see top trace of FIG. 27 for sample PD516) which is attributed to the formation of a $Ga_2Se_3$ surface layer imaged by EDS elemental mapping (see FIG. 32).

In an embodiment, no external Se was supplied, so the formation of $Ga_2Se_3$ consumes Se from the substrate, creating an underlying Bi-rich $Bi_xSe_y$ layer. The mass-transport possibilities creating this $Bi_xSe_y$ are the same as they were for ZnSe formation: (1) the Ga might be displacing Bi, which then migrates downwards, or (2) the $Bi_2Se_3$ might be releasing Se, which then travels upwards to combine with the incoming Ga flux.

Figures 33A, 33B:
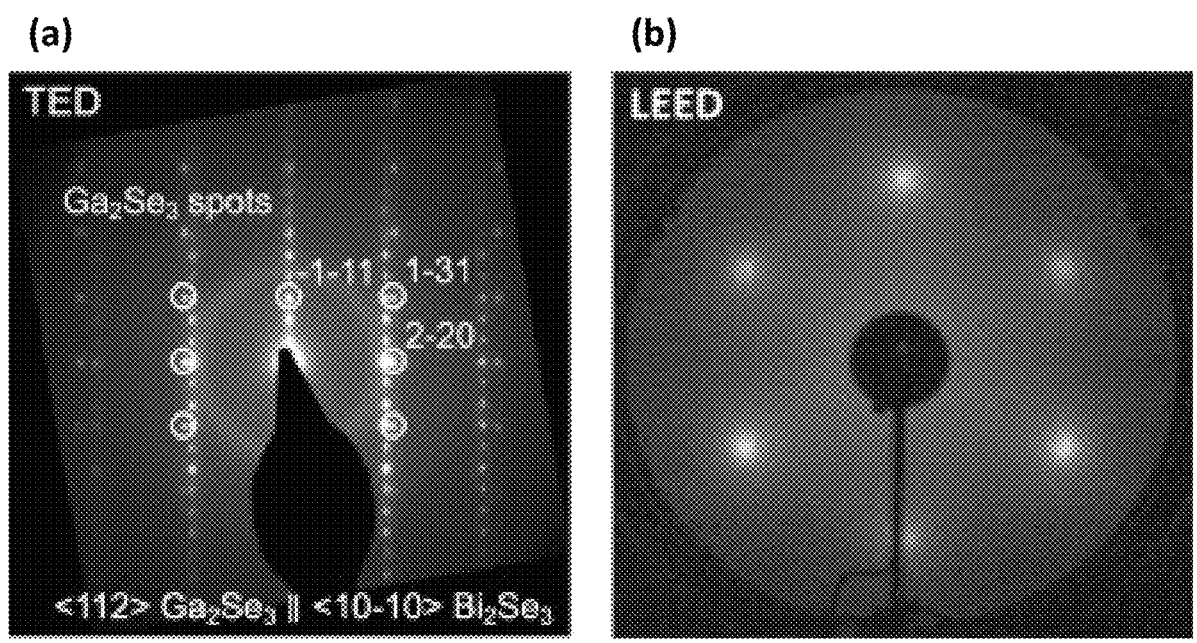
FIG. 33a depicts transmission electron diffraction of the $Ga_2Se_3$ created by annealing $Bi_2Se_3$ (0001) under TEGa is consistent with the formation of cubic (zincblende) $Ga_2Se_3$ (111) with ⅓ Ga sites vacant ($d_{111}$=3.14 Å, $d_{220}$=1.93 Å). In this area {111} $Ga_2Se_3$∥(0001) $Bi_2Se_3$ and ⟨112⟩ $Ga_2Se_3$∥<10-10>$Bi_2Se_3$.
FIG. 33b depicts a 60-eV low-energy electron diffraction (LEED) image of the $Ga_2Se_3$ (111) surface, indicating that it is flat and well-ordered. [Sample PD516].

Transmission electron diffraction patterns (see FIG. 33a) are consistent with the formation of cubic $Ga_2Se_3$ with disordered Ga vacancies. The corresponding LEED pattern (see FIG. 33b) is 3-fold symmetric, consistent with the formation of a flat, well-ordered (111) surface. The lattice constant of cubic $Ga_2Se_3$ is similar to that of Si and GaP (111), enabling other epitaxial growth and liftoff beyond the GaAs growth and liftoff disclosed herein.

GaAs Liftoff

In an embodiment, a GaAs layer was exfoliated from a $GaAs/ZnSe/Bi_2Se_3$ sample. This was done by attaching the bottom of the $Bi_2Se_3$ substrate to one glass slide using double sided adhesive tape and the top of the GaAs layer to another, then applying a slight pressure to peel the two slides apart. The results of this experiment showed that the GaAs is separated from the underlying substrate with a shallow cleavage depth over the entire region tested (half of a 1 cm×1 cm sample).

In an embodiment, GaAs (111) was grown on layered-2D $Bi_2Se_3$ (0001) substrates in an MOCVD reactor by first converting the surface layers of $Bi_2Se_3$ to ZnSe by annealing under DEZn, then growing GaAs using TEGa and $AsH_3$.

The ZnSe layer serves two purposes simultaneously. The first is that it prevents reactions between Ga and the $Bi_2Se_3$ substrate. Without a ZnSe layer, TEGa readily reacts with the substrate to form cubic $Ga_2Se_3$. At the same time, the resulting ZnSe surface also serves as a lattice-matched zincblende growth template for GaAs. The resulting GaAs epilayer is then readily separated from the underlying $Bi_2Se_3$ substrate.

The Examples discussed above are provided for purposes of illustration and are not intended to be limiting. Still other embodiments and modifications are also contemplated.

While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope.

We claim:

1. A method for making a semiconductor device comprising exfoliating a Selenide-based 2D layered material whereby the exfoliation creates a surface of Selenide-based 2D layered material; and converting the surface of the Selenide-based 2D layered material to ZnSe.

2. The method of claim 1 wherein the ZnSe is lattice matched to the layer of Selenide-based 2D layered material.

3. The method of claim 1 wherein the ZnSe is lattice mismatched to the layer of Selenide-based 2D layered material.

4. The method of claim 1 wherein the Selenide-based 2D layered material comprises $Bi_2Se_3$.

5. The method of claim 1 wherein the surface of Selenide-based 2D layered material is converted to $In_2Se_3$ before converting the surface to ZnSe.

6. The method of claim 1 further comprising epitaxial growth of GaAs on the layer of ZnSe.

7. The method of claim 1 further comprising lifting off the semiconductor device from the Selenide-based 2D layered material and using the resulting Selenide-based-2D layered material for making a semiconductor device.

8. The method of claim 1 wherein the resulting Selenide-based-2D layered material is a (0001) basal plane substantially free of surface steps.

9. The method of claim 8 wherein the ZnSe is lattice matched to the layer of Selenide-based 2D layered material.

10. The method of claim 8 wherein the ZnSe is lattice mismatched to the layer of Selenide-based 2D layered material.

11. The method of claim 8 wherein the Selenide-based 2D layered material comprises $Bi_2Se_3$.

12. The method of claim 8 wherein the surface of Selenide-based 2D layered material is converted to $In_2Se_3$ before converting the surface to ZnSe.

13. The method of claim 8 further comprising epitaxial growth of GaAs on the layer of ZnSe.

14. The method of claim 8 further comprising lifting off the semiconductor device from the Selenide-based 2D layered material and using the resulting Selenide-based-2D layered material for making a semiconductor device.

15. A method for making patterned semiconductor layers, comprising exfoliating a $Bi_2Se_3$ material whereby the exfoliation creates a surface that is a (0001) basal plane substantially free of surface steps; and laterally patterning the surface by masking portions of the surface and converting the non-masked portions of the surface to ZnSe; and epitaxial growth of GaAs on the patterned layer of ZnSe.

16. The method of claim 15 wherein the surface is converted to $In_2Se_3$ before converting the non-masked portions of the surface to ZnSe.

17. The method of claim 15 wherein the $Bi_2Se_3$ material that is a (0001) basal plane substantially free of surface steps is laterally patterned by masking portions of the surface material and converting the non-masked portions of the surface material to $In_2Se_3$ or ZnSe.

18. The method of claim 17 wherein the surface of $Bi_2Se_3$ is converted to $In_2Se_3$ before laterally patterning the surface by masking portions of the surface and converting the non-masked portions of the surface to ZnSe.

19. A method for growing GaAs (111) on layered-2D $Bi_2Se_3$ (0001) substrates in an MOCVD reactor wherein the first step is converting the surface layers of $Bi_2Se_3$ (0001) to ZnSe by annealing in the presence of diethylzinc, and the second step is growing GaAs in the presence of triethylgallium and $AsH_3$.

20. The method of claim 19 wherein the annealing of $Bi_2Se_3$ (0001) in the presence of diethylzinc occurs at a temperature which decreases from 400° C. to 300° C. over about 20 min.

* * * * *